US012183764B2

(12) United States Patent
Chang et al.

(10) Patent No.: US 12,183,764 B2
(45) Date of Patent: Dec. 31, 2024

(54) CHANNEL PATTERN DESIGN TO IMPROVE CARRIER TRANSFER EFFICIENCY

(71) Applicant: Taiwan Semiconductor Manufacturing Company, Ltd., Hsinchu (TW)

(72) Inventors: Yung-Chang Chang, Taipei (TW); Shih-Wei Lin, Taipei (TW); Te-Hsien Hsieh, Kaohsiung (TW); Jung-I Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 395 days.

(21) Appl. No.: 17/735,420

(22) Filed: May 3, 2022

(65) Prior Publication Data

US 2023/0253435 A1 Aug. 10, 2023

Related U.S. Application Data

(60) Provisional application No. 63/307,663, filed on Feb. 8, 2022.

(51) Int. Cl.
*H01L 27/146* (2006.01)

(52) U.S. Cl.
CPC .. *H01L 27/14643* (2013.01); *H01L 27/14636* (2013.01); *H01L 27/14683* (2013.01)

(58) Field of Classification Search
None
See application file for complete search history.

(56) References Cited

U.S. PATENT DOCUMENTS

| 11,114,488 B1 | 9/2021 | Lu et al. |
| 2006/0060932 A1 | 3/2006 | Rafferty et al. |

(Continued)

FOREIGN PATENT DOCUMENTS

| CN | 111968999 A | 11/2020 |
| CN | 113314550 A | 8/2021 |

(Continued)

OTHER PUBLICATIONS

Zhang et al. "A comparison of APD and SPAD based receivers for visible light communications" Journal of Lightwave Technology (vol. 36, Issue: 12, Jun. 15, 2018). Published on Feb. 28, 2018.

(Continued)

*Primary Examiner* — William C Trapanese
(74) *Attorney, Agent, or Firm* — Eschweiler & Potashnik, LLC

(57) ABSTRACT

The present disclosure relates to an image sensor integrated chip. The image sensor integrated chip includes a photodiode region disposed within a substrate having a first semiconductor material region. A second semiconductor material region is disposed onto the substrate. A patterned doped layer is arranged between the substrate and the second semiconductor material region. The second semiconductor material region includes a sidewall connecting to a bottom surface of the second semiconductor material region. The sidewall extends through the patterned doped layer. A bottom surface of the second semiconductor material region is directly over the photodiode region.

20 Claims, 20 Drawing Sheets

(56) References Cited

U.S. PATENT DOCUMENTS

| | | | |
|---|---|---|---|
| 2010/0059846 A1* | 3/2010 | Kim | H01L 27/14636 |
| | | | 257/E21.585 |
| 2020/0219920 A1* | 7/2020 | Hur | H01L 27/14623 |
| 2020/0335546 A1 | 10/2020 | Miura | |
| 2021/0098524 A1 | 4/2021 | Liu et al. | |
| 2021/0351306 A1 | 11/2021 | Adusumilli et al. | |
| 2022/0367638 A1 | 11/2022 | Liao et al. | |

FOREIGN PATENT DOCUMENTS

| WO | 2018187370 A1 | 10/2018 |
|---|---|---|
| WO | 2018191539 A1 | 10/2018 |

OTHER PUBLICATIONS

Takai et al. "Single-Photon Avalanche Diode with Enhanced NIR-Sensitivity for Automotive LIDAR Systems" Sensors 2016, 16, 459; doi:10.3390/s16040459. Published on Mar. 30, 2016.

Canon News Tech. "Canon Develops World's First 1 Megapixel SPAD Image Sensor" Published on Jun. 25, 2020.

* cited by examiner

CHANNEL PATTERN DESIGN TO IMPROVE CARRIER TRANSFER EFFICIENCY

REFERENCE TO RELATED APPLICATION

This application claims the benefit of U.S. Provisional Application No. 63/307,663, filed on Feb. 8, 2022, the contents of which are hereby incorporated by reference in their entirety.

BACKGROUND

Image sensors are solid-state devices that are configured to convert incoming light into an electrical signal. Image sensors operate according to the photoelectric effect, a phenomenon by which electrons-hole pairs are generated when incident light strikes an atom within a semiconductor body. The electrons and holes are moved in different directions to generate an electrical signal, which may be provided to a processor that can convert the electrical signal to data. Integrated chips (ICs) with image sensors are used in a wide range of modern-day electronic devices, such as cell phones, security cameras, medical devices, advanced driver assistance systems (e.g., forward collision warning (FCW), autonomous emergency breaking (AEB), pedestrian detection, or the like), etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
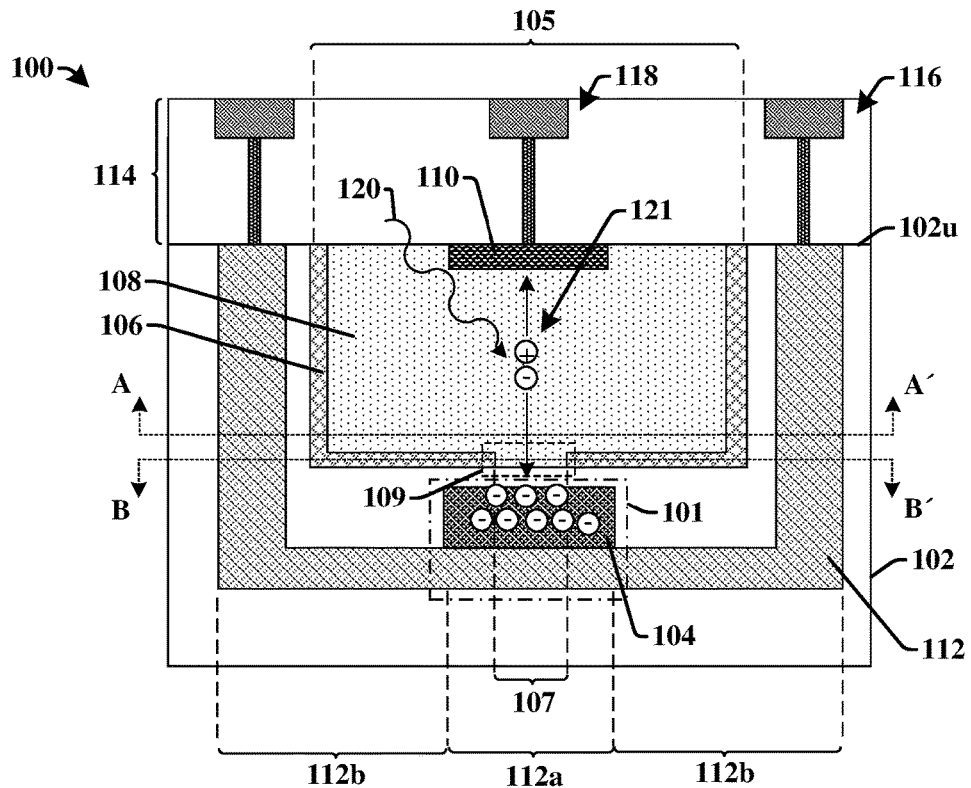
FIGS. 1A-1C illustrate some embodiments of an image sensor integrated chip comprising a patterned doped layer disposed between different semiconductor materials.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A single photon avalanche diode (SPAD) is a solid-state photodetector that can be illuminated with incident radiation spanning a wide range of the electromagnetic spectrum (e.g., gamma, x-rays, beta and alpha particles, ultraviolet (UV) radiation, visible light, infrared (IR) radiation, etc.). An SPAD typically comprises a first doped region (e.g., a p-doped region) and a second doped region (e.g., an n-doped region) arranged within a semiconductor substrate. During operation, an incident photon may strike the substrate and generate an electron-hole pair. The first doped region and the second doped region are subjected to a high bias voltage that increases an electric field across a depletion region. The high bias voltage is above breakdown voltage, so as to cause the SPAD to operate in Geiger mode and to generate a self-sustaining avalanche current (e.g., having more $>10^6$ electrons) within a multiplication region from the single incident photon.

While silicon is often used in CMOS (complementary metal-oxide-semiconductor) processes, other semiconductor materials may have band-gaps that provide photonic devices with a better performance than silicon for wavelengths that are outside of the visible spectrum. Therefore, during fabrication of an SPAD, a semiconductor substrate may be etched to form a recess, which is subsequently filled with a second semiconductor material. In such devices, during operation an incident photon may strike the second semiconductor material and generate an electron-hole pair. The electron is subsequently moved into the semiconductor substrate, where a self-sustaining avalanche current is generated within a multiplication region.

However, it has been appreciated that the etching processes used to form the recess can damage the semiconductor substrate, resulting in defects (e.g., interfacial defects, dangling bonds, etc.) along an interface between the semiconductor substrate and the second semiconductor material. The defects may trap charge carriers (e.g., electrons) and cause unwanted leakage currents that lead to dark current and/or white pixel issues within the SPAD. To prevent dark current and/or white pixel issues within an SPAD, an implantation process may be performed to implant dopants along edges of the recess. The dopants are selected to have a doping type that prevents the movement of charge carriers, thereby mitigating the leakage current. However, such dopants will increase a barrier height between the semiconductor material and the multiplication region, thereby reducing a performance (e.g., a photodiode efficiency) the SPAD.

The present disclosure relates to an image sensor integrated chip. The image sensor integrated chip includes a substrate comprising a first semiconductor material. A second semiconductor material is arranged onto the substrate. The second semiconductor material is separated from the substrate by a patterned doped layer. A photodiode region is disposed within the substrate below the second semiconductor material. The patterned doped layer comprises sidewalls defining a channel opening directly over the photodiode region. The second semiconductor material extends through the channel opening to contact the substrate. During operation, an electron-hole pair may be formed within the second semiconductor material. However, because the second semiconductor material contacts the first semiconductor material, there is a relatively low barrier between the second semiconductor material and the photodiode region. The relatively low barrier increases performance of the image sensor integrated chip while the patterned doped layer decreases leakage currents, thereby providing the disclosed image sensor integrated chip with both a good performance and a low dark current.

FIG. 1A illustrates a cross-sectional view of some embodiments of an image sensor integrated chip 100 comprising a patterned doped layer disposed between different semiconductor materials.

The image sensor integrated chip 100 includes a substrate 102 that comprises or is a first semiconductor material (e.g., a first semiconductor material region). A second semiconductor material 108 (e.g., a second semiconductor material region) is disposed on the substrate 102. In some embodiments, the substrate 102 has sidewalls and a horizontally extending surface that define a recess 105 disposed within an upper surface 102u of the substrate 102. In such embodiments, the second semiconductor material 108 may be disposed within the recess 105. The second semiconductor material 108 is a different material than the first semiconductor material. For example, the first semiconductor material may be silicon and the second semiconductor material 108 may comprise or be germanium. In some embodiments, a first doped contact region 110 is disposed along an upper surface of the second semiconductor material 108.

A patterned doped layer 106 is arranged between the substrate 102 and the second semiconductor material 108. The patterned doped layer 106 is configured to passivate defects (e.g., traps) arranged along one or more surfaces of the substrate 102. By passivating defects along the one or more surfaces of the substrate 102, leakage along the one or more surfaces can be improved. The patterned doped layer 106 comprises sidewalls defining one or more channel openings 107 that extends through the patterned doped layer 106. The second semiconductor material 108 comprises a protrusion 109 that extends outward from a lower surface of the second semiconductor material 108 to directly between the sidewalls of the patterned doped layer 106. In some embodiments, the protrusion 109 is defined by sidewalls that are coupled to a bottom surface of the second semiconductor material 108. The protrusion 109 directly contacts the substrate 102.

In some embodiments, the substrate 102 and the patterned doped layer 106 are a same semiconductor material. For example, the substrate 102 may comprise a silicon substrate and the patterned doped layer 106 may comprise a patterned doped silicon layer. In some embodiments, the patterned doped layer 106 may comprise an epitaxial layer that is a same material as the substrate 102. In other embodiments, the patterned doped layer 106 may comprise a doped region that is within the substrate 102. In some embodiments, the patterned doped layer 106 is arranged along the sidewalls and the horizontally extending surface of the substrate 102 defining the recess 105. In such embodiments, the patterned doped layer 106 is both vertically and laterally between the substrate 102 and the second semiconductor material 108.

A photodiode region 101 is arranged within the substrate 102 directly below the one or more channel openings 107. In some embodiments, the photodiode region 101 may comprise or be a part of a single photon avalanche diode (SPAD). In some embodiments, the photodiode region 101 comprises a first doped region 104 having a first doping type (e.g., comprising p-type dopants) and a second doped region 112 having a second doping type (e.g., comprising n-type dopants). In some embodiments, the second doped region 112 continuously extends from the upper surface 102u of the substrate 102 to below the first doped region 104. In such embodiments, a first part 112a of the second doped region 112 that is directly below the first doped region 104 forms a p-n junction of a photodiode region 101, while a second part 112b of the second doped region 112 that is laterally outside of the first doped region 104 forms an electrical connection.

In some embodiments, a first plurality of interconnects 116 and a second plurality of interconnects 118 are disposed within a dielectric structure 114 over the upper surface 102u of the substrate 102. The first plurality of interconnects 116 are coupled to the second doped region 112 and the second plurality of interconnects 118 are coupled to the first doped contact region 110.

During operation, the first plurality of interconnects 116 are configured to apply a first bias voltage (e.g., a positive bias voltage) to the second doped region 112, and the second plurality of interconnects 118 are configured to apply a second bias voltage (e.g., a negative bias voltage) to the first doped contact region 110. A difference between the bias voltages may be in a range of between approximately 10 V (volts) and approximately 30 V, between approximately 15 V and approximately 20 V, approximately 17 V, or other similar values. When an incident photon 120 strikes an atom within the second semiconductor material 108, the atom may release an electron to form an electron-hole pair 121. The bias voltages cause the electron and the hole to move in opposite directions. As the electron leaves the second semiconductor material 108, it travels into the first doped region 104 (e.g., a multiplication region) of the substrate 102. Due to a high reverse bias voltage, impact ionization occurs within the first doped region 104 and causes an avalanche multiplication to occur and generate additional electrons. The additional electrons are provided to the second doped region 112 as a photocurrent.

Typically, an un-patterned doped layer may provide an energy barrier to the flow of electrons and/or holes from the second semiconductor material 108 to the substrate 102, thereby decreasing a photocurrent generated by the image sensor integrated chip 100. However, the one or more channel openings 107 in the patterned doped layer 106 mitigate a barrier to the flow of electrons and/or holes to within the substrate 102, and improve a performance of the image sensor integrated chip 100 (e.g., a photodiode efficiency). Furthermore, because the patterned doped layer 106 remains between the substrate 102 and the second semiconductor material 108 leakage within the image sensor integrated chip 100 is also improved, thereby reducing a dark current and/or dark current rate, a jitter, etc.

Figure 1B:
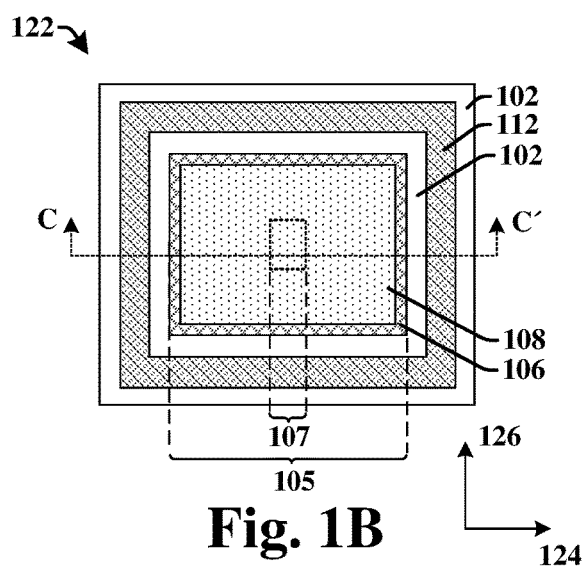
Figure 1C:
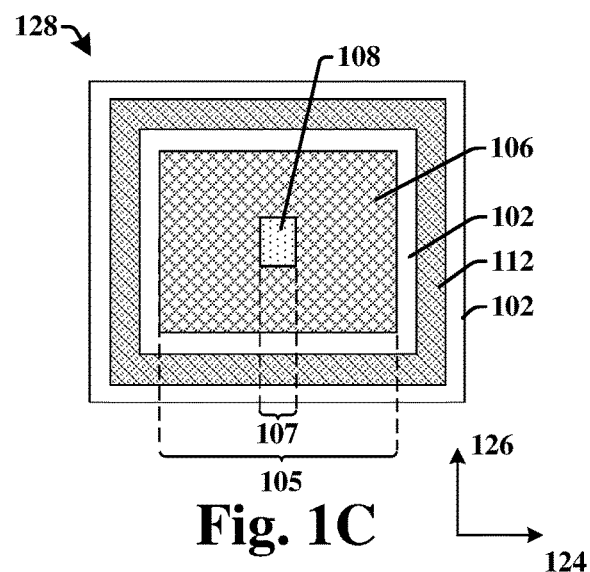

FIG. 1B illustrates a top-view 122 of some embodiments of the image sensor integrated chip 100 of FIG. 1A taken along cross-sectional line A-A'. FIG. 1C illustrates a top-view 128 of some embodiments of the image sensor integrated chip 100 of FIG. 1A taken along cross-sectional line B-B'. In some embodiments, the cross-sectional view of FIG. 1A may be taken along cross-sectional line C-C' of the top-view 122.

As shown in the top-views 122 and 128, the second semiconductor material 108 extends past the one or more channel openings 107 in a first direction 124 and in a second direction 126 that is perpendicular to the first direction 124. The patterned doped layer 106 wraps around an outer perimeter of the second semiconductor material 108 in a first closed and unbroken loop. In some embodiments, the second doped region 112 may wrap around an outer perimeter of the second semiconductor material 108 in a second closed and unbroken loop. In some embodiments, the patterned doped layer 106 and the second doped region 112 may be substantially concentric about a center of the second semiconductor material 108.

Figure 2A:
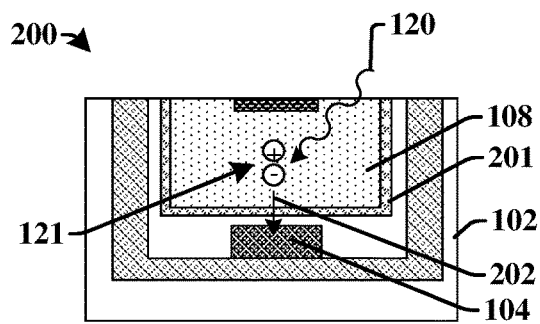
FIGS. 2A-2C illustrate some embodiments of energy barriers associated with different image sensor integrated chips having different doped layers.

FIG. 2A illustrates a cross-sectional view of some embodiments of an image sensor integrated chip 200 comprising an un-patterned doped layer disposed between different semiconductor materials.

The image sensor integrated chip 200 comprises a second semiconductor material 108 separated from a substrate 102 by an un-patterned doped layer 201. During operation, an incident photon 120 may form an electron-hole pair 121 within the second semiconductor material 108. The electron of the electron-hole pair 121 may follow a first path 202 that extends from within the second semiconductor material 108 to a first doped region 104 within the substrate 102. The first path 202 extends through the un-patterned doped layer 201.

Figure 2B:
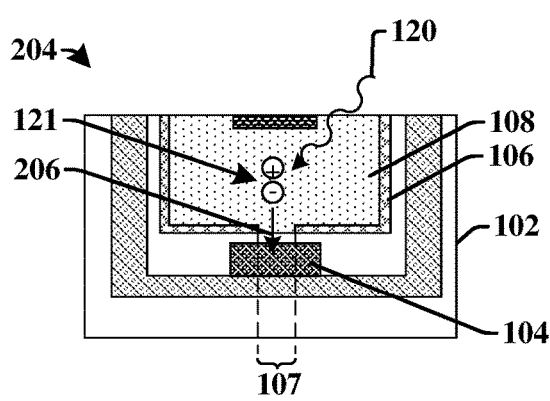

FIG. 2B illustrates a cross-sectional view of some embodiments of an image sensor integrated chip 204 comprising a patterned doped layer disposed between different semiconductor materials.

The image sensor integrated chip 204 comprises a second semiconductor material 108 separated from a substrate 102 by a patterned doped layer 106. During operation, an incident photon 120 may form an electron-hole pair 121 within the second semiconductor material 108. The electron of the electron-hole pair 121 may follow a second path 206 that extends from within the second semiconductor material 108 to a first doped region 104 of the substrate 102. The second path 206 extends through one or more channel openings 107 extending through the patterned doped layer 106.

Figure 2C:
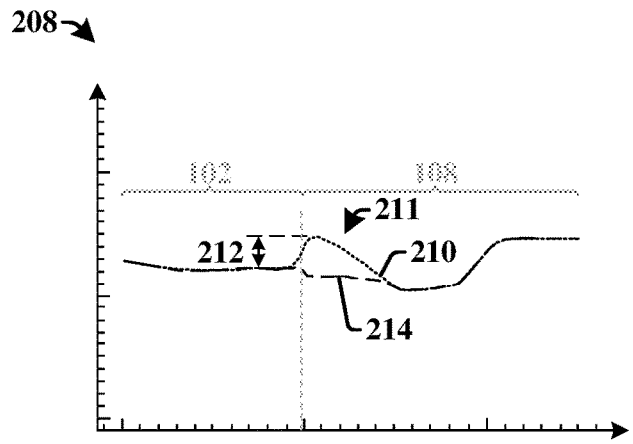

FIG. 2C illustrates some embodiments of a graph 208 showing a conductive band diagram corresponding to the image sensor integrated chips of FIGS. 2A and 2B.

The graph 208 illustrates a first energy band diagram 210 taken along the first path 202 of the image sensor integrated chip 200 of FIG. 2A. The first energy band diagram 210 comprises an energy barrier 211 between the substrate 102 and the second semiconductor material 108. The energy barrier 211 has a barrier height 212 that is equal to approximately 0.6 eV, approximately 0.4 eV, or other similar values. The graph 208 further comprises a second energy band diagram 214 taken along the second path 206 of the image sensor integrated chip 204 of FIG. 2B. The second energy band diagram 214 has a smaller barrier (e.g., a barrier having a height of approximately 0.2 eV, approximately 0 eV, or other similar values) between the substrate 102 and the second semiconductor material 108. The smaller barrier is due to the second path 206 extending through the one or more channel openings 107 within the patterned doped layer 106. Because the patterned doped layer provides for a lower barrier height between the substrate 102 and the second semiconductor material 108, the disclosed image sensor integrated chip is able to have improved performance over an image sensor integrated chip having an un-patterned doped layer.

Figure 3A:
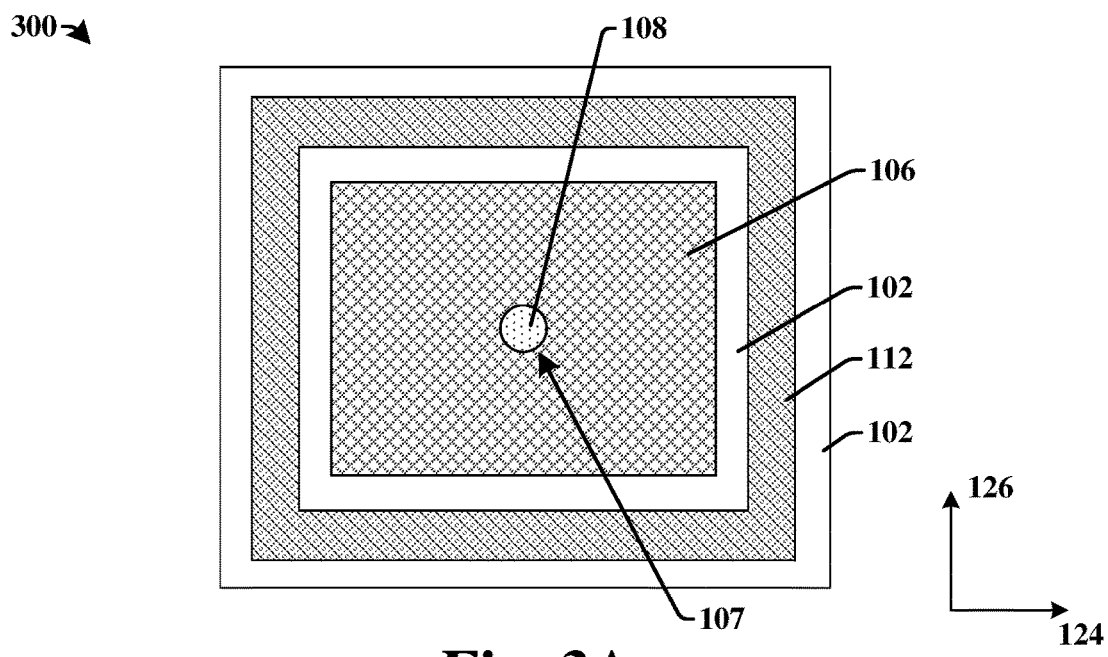
FIGS. 3A-3C illustrate top-views of some embodiments of image sensor integrated chips comprising patterned doped layers.
Figure 3B:
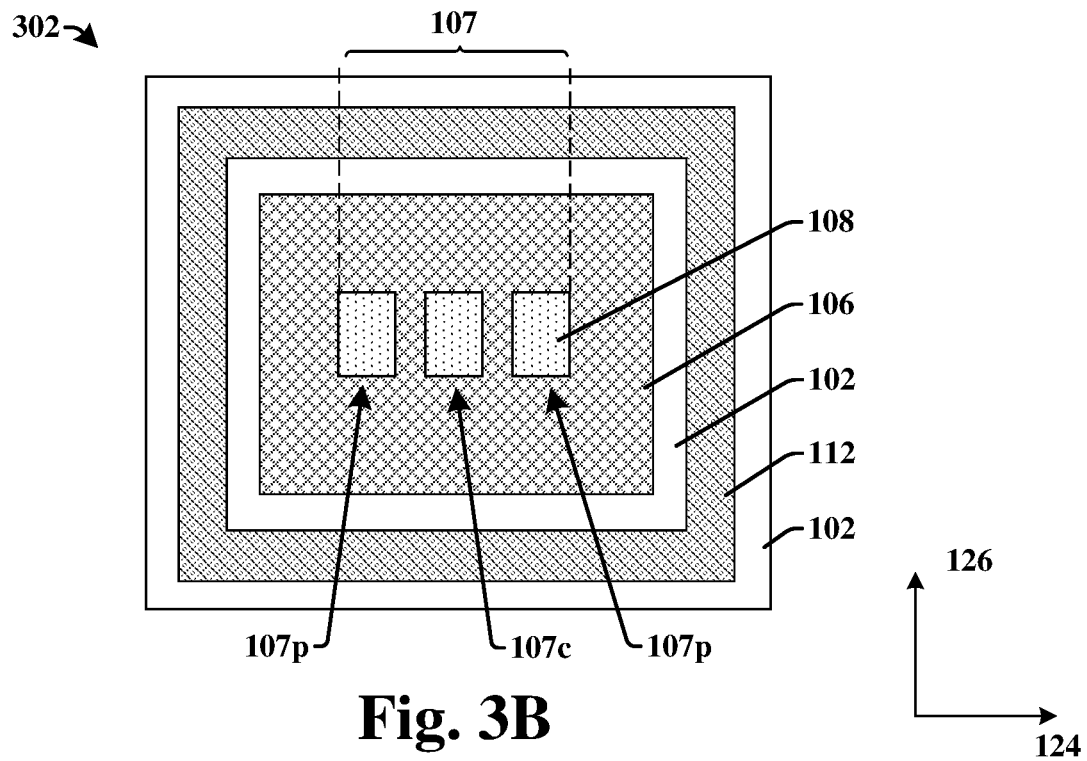
Figure 3C:
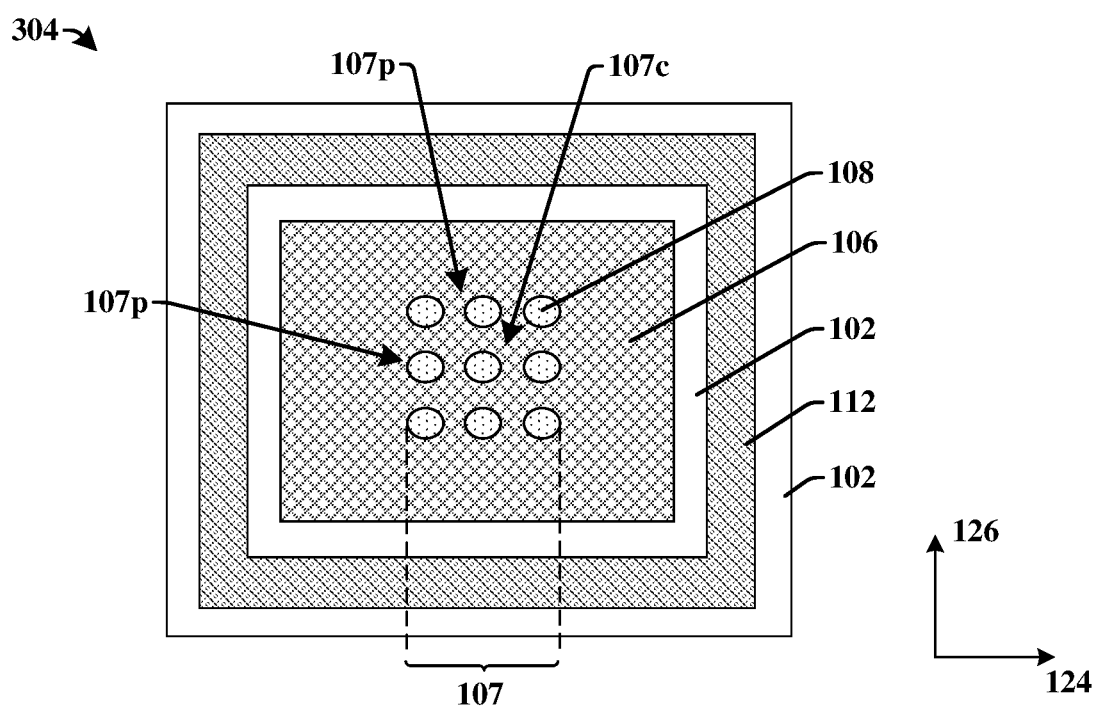

It will be appreciated that in various embodiments the disclosed one or more channel openings may have different sizes, shapes, and/or spatial configurations within the patterned doped layer. The different sizes, shapes, and/or spatial configurations allow for different performances to be achieved with corresponding photodiode structures. For example, having one or more channel openings that collectively provide for a larger overall channel opening size will improve electron transfer from the second semiconductor material to a photodiode region, but may also lead to higher leakage, increased dark current, and/or the like. Conversely, having one or more channel openings that collectively provide for a smaller overall channel opening size will lead to lower leakage, lower dark current, and/or the like, but may also lead to decreased electron transfer from the second semiconductor material to a corresponding photodiode region. FIGS. 3A-3C illustrate top-views of some embodiments of patterned doped layers having one or more channel openings with different sizes, shapes, and/or spatial configurations.

FIG. 3A illustrates a top-view 300 of some embodiments of an image sensor integrated chip comprising one or more channel openings 107 surrounded by a patterned doped layer 106. The patterned doped layer 106 is further surrounded by the second doped region 112. In some embodiments, the one or more channel openings 107 comprise a single circular shaped channel opening defined by one or more sidewalls of the patterned doped layer 106. In other embodiments, the one or more channel openings 107 may comprise a different shaped single channel opening (e.g., a square shaped channel opening, a circular shaped channel opening, an oval shaped channel opening, a polygonal shaped channel opening, etc.). A second semiconductor material 108 extends to within the one or more channel openings 107. In some embodiments, the single circular shaped channel opening may be substantially centered within the patterned doped layer 106 along a first direction 124 and along a second direction 126 that is perpendicular to the first direction 124.

FIG. 3B illustrates a top-view 302 of some additional embodiments of an image sensor integrated chip comprising one or more channel openings 107 surrounded by a patterned doped layer 106. The one or more channel openings 107 comprise a plurality of separate channel openings respectively defined by one or more sidewalls of the patterned doped layer 106. A second semiconductor material 108 extends to within the one or more channel openings 107. In some embodiments, the plurality of separate channel openings are arranged within a one-dimensional array, such that the plurality of separate channel openings are separated from one another along the first direction 124 by the patterned doped layer 106. In some embodiments, the plurality of separate channel openings comprise a plurality of rectangular shaped channel openings. In other embodiments, the plurality of separate channel openings may comprise different shaped channel openings (e.g., square shaped channel openings, circular shaped channel openings, oval shaped channel openings, polygonal shaped channel openings, etc.). In some embodiments, the one-dimensional array is centered within the patterned doped layer 106. In some embodiments, the plurality of separate channel openings comprise a central channel opening 107c that is centered within the patterned doped layer 106 along the first direction 124 and along the second direction 126. In some additional embodiments, the plurality of separate channel openings further comprise peripheral channel openings 107p that are symmetrically disposed along opposing sides of the central channel opening 107c along the first direction 124.

FIG. 3C illustrates a top-view 304 of some additional embodiments of an integrated chip comprising one or more channel openings 107 surrounded by a patterned doped layer 106. The one or more channel openings 107 comprise a plurality of separate channel openings respectively defined by one or more sidewalls of the patterned doped layer 106. A second semiconductor material 108 extends to within the one or more channel openings 107. In some embodiments, the plurality of separate channel openings are arranged within a two-dimensional array, such that the plurality of separate channel openings are separated from one another along the first direction 124 and along the second direction 126 by the patterned doped layer 106. In some embodiments, the plurality of separate channel openings comprise a plurality of circular shaped channel openings. In other embodiments, the plurality of separate channel openings may comprise different shaped channel openings (e.g., square shaped channel openings, rectangular shaped channel openings, oval shaped channel openings, polygonal shaped channel openings, etc.). In some embodiments, the two-dimensional array is centered within the patterned doped layer 106. In some embodiments, the plurality of separate channel openings comprise a central channel opening 108c that is centered within the patterned doped layer 106 along the first direction 124 and along the second direction 126. In some additional embodiments, the plurality of separate channel openings further comprise peripheral channel openings 108p that are symmetrically disposed along opposing sides of the central channel opening 108c along the first direction 124 and along the second direction 126.

Figure 4A:
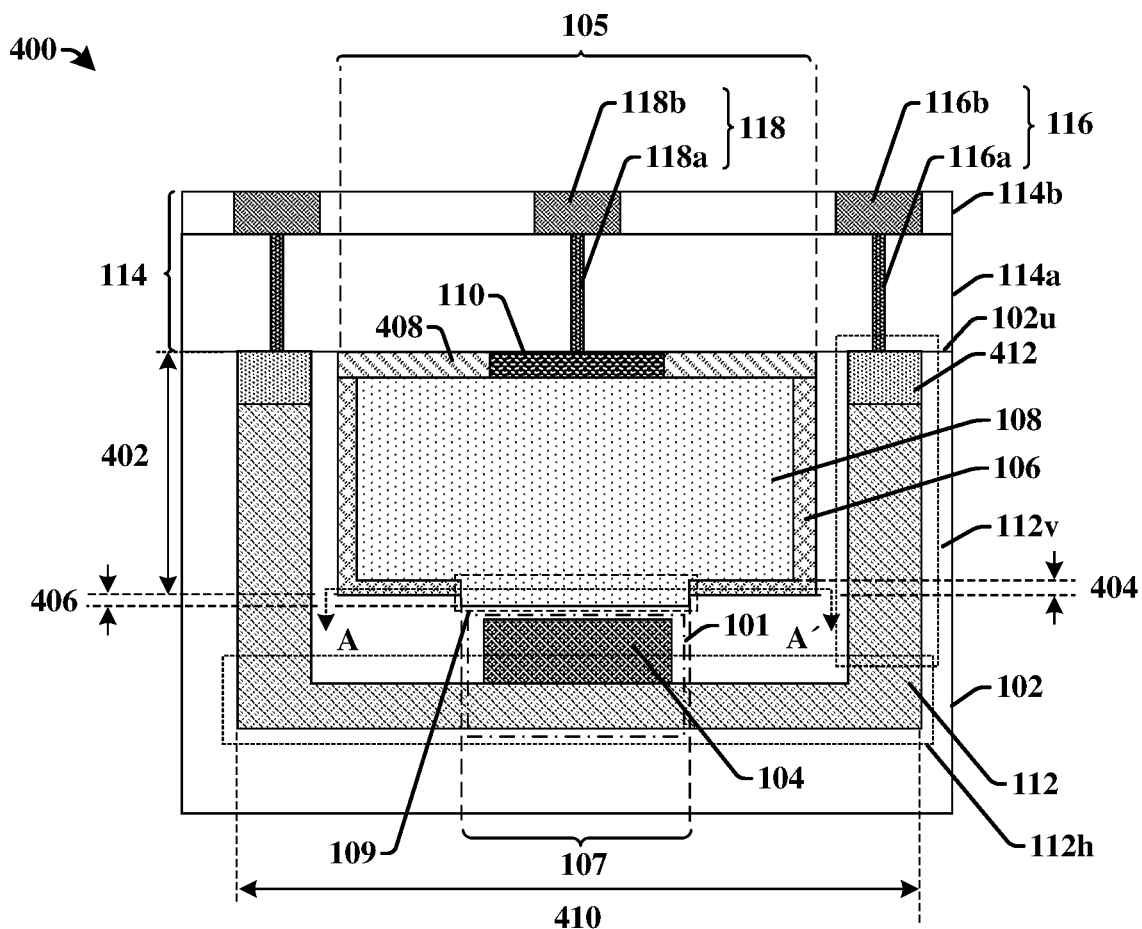
FIGS. 4A-4B illustrate some additional embodiments of an image sensor integrated chip comprising a patterned doped layer.

FIG. 4A illustrates a cross-sectional view of some additional embodiments of an image sensor integrated chip 400 comprising a disclosed patterned doped layer.

The image sensor integrated chip 400 comprises a substrate 102 having sidewalls and a horizontally extending surface that define a recess 105 disposed within an upper surface of the substrate 102. In some embodiments, the substrate 102 may comprise a first semiconductor material. In some embodiments, the recess 105 may extend into the substrate 102 to a first depth 402 that is in a range of between approximately 0 microns (μm) and approximately 5 μm, between approximately 0 μm and approximately 3 μm, between approximately 1 μm and approximately 3 μm, or other similar values. In some embodiments, the recess 105 is disposed within a pixel region 410. In some embodiments, the pixel region 410 may have width that is in a range of between approximately 5 μm and approximately 20 μm, between approximately 1 μm and approximately 10 μm, or other similar values.

A patterned doped layer 106 is arranged along the sidewalls and the horizontally extending surface of the substrate 102. The patterned doped layer 106 comprises sidewalls that define one or more channel openings 107. In some embodiments, the patterned doped layer 106 may comprise a doped epitaxial layer that extends along the sidewalls and the horizontally extending surface of the substrate 102. In other embodiments, the patterned doped layer 106 may comprise a doped region implanted into the substrate 102. In some embodiments, the patterned doped layer 106 may comprise a first doping-type (e.g., p-type silicon doped with boron, aluminum, gallium, or the like). In some embodiments, the patterned doped layer 106 may have a thickness 404 that is substantially uniform. In some embodiments, the thickness 404 may be in a range of between approximately 0 Angstroms (Å) and approximately 500 Å, between approximately 10 Å and approximately 400 Å, between approximately 100 Å and approximately 300 Å, or other similar values.

A second semiconductor material 108 is disposed within the recess 105 and on the patterned doped layer 106. The second semiconductor material 108 is a different material than the substrate 102. In some embodiments, the second semiconductor material 108 may be selected to have a good efficiency for incident radiation having wavelengths above the visible light spectrum. For example, the second semiconductor material 108 may comprise or be germanium. The patterned doped layer 106 is between the substrate 102 and the second semiconductor material 108. In some embodiments, the patterned doped layer 106 is both vertically and laterally between the substrate 102 and the second semiconductor material 108.

The second semiconductor material 108 comprises a protrusion 109 that extends outward from a lower surface of the second semiconductor material 108 to directly between sidewalls of the patterned doped layer 106. In some embodiments, the protrusion 109 may extend to a non-zero distance 406 below a bottom of the patterned doped layer 106. In such embodiments, the protrusion 109 of the second semiconductor material 108 both vertically and laterally contacts the substrate 102 below the bottom of the patterned doped layer 106. In some embodiments, the non-zero distance 406 may be in a range of between approximately 0 Å and approximately 500 Å, between approximately 10 Å and approximately 400 Å, between approximately 100 Å and approximately 300 Å, or other similar values. In some embodiments, the protrusion 109 may be completely confined laterally between opposing sides of the photodiode region 101. In other embodiments (not shown), the protrusion 109 laterally extends past opposing sides of the photodiode region 101.

In some embodiments, a capping layer 408 is arranged over the second semiconductor material 108. The capping layer 408 may comprise a third semiconductor material. In some embodiments, the third semiconductor material may comprise or be a same semiconductor material as the first semiconductor material of the substrate 102. For example, the first semiconductor material and the third semiconductor material may comprise or be silicon. The capping layer 408 vertically extends from an upper surface of the substrate 102 to contact a top of the second semiconductor material 108. In some embodiments, the capping layer 408 and the upper surface 102u of the substrate 102 are substantially co-planar (e.g., planar within a tolerance of a chemical mechanical planarization (CMP) process). In some embodiments, the capping layer 408 completely covers a top of the second semiconductor material 108. In some embodiments, the capping layer 408 may comprise opposing outermost sidewalls that laterally contact sidewalls of the substrate 102. In other embodiments (not shown), the capping layer 408 may comprise opposing outermost sidewalls that laterally contact sidewalls of the patterned doped layer 106.

A first doped contact region 110 is disposed within the capping layer 408. In some embodiments, the first doped contact region 110 is disposed directly over the one or more channel openings 107. some embodiments, the first doped contact region 110 comprises p-type region. For example, the first doped contact region 110 may comprise the first doping type (e.g., p-type silicon doped with boron, aluminum, gallium, or the like). In some embodiments, the first doped contact region 110 may be confined to within the capping layer 408. In other embodiments (not shown), the first doped contact region 110 may extend from within the capping layer 408 to within the second semiconductor material 108.

A photodiode region 101 is arranged within the substrate 102 below the one or more channel openings 107. In some embodiments, the photodiode region 101 comprises a first doped region 104 having the first doping type (e.g., a p-type doping) and a second doped region 112 having a second doping type (e.g., an n-type doping). In some embodiments, the first doped region 104 may comprise p-type silicon (e.g., doped with boron, aluminum, gallium, or the like) and the second doped region 112 may comprise n-type silicon (e.g., doped with arsenic, phosphorus, or the like). In some embodiments, the second doped region 112 extends from the upper surface 102u of the substrate 102 to below the first doped region 104. In such embodiments, the second doped region 112 comprises a horizontally extending second doped region 112h and a vertically extending second doped region 112v protruding outward from a top of the horizontally extending second doped region 112h. In some alternative embodiments (not shown), the photodiode region 101 may extend into the second semiconductor material 108. In some such embodiments, a part of the second semiconductor material 108 may comprise the first doping type, so as to act as the first doped region. In some embodiments, the part of the second semiconductor material 108 that comprises the first doping type may be separated from the second doped region 112 within the substrate 102 by an intrinsically doped part of the substrate 102 that is arranged vertically therebetween.

In some embodiments, a dielectric structure 114 is arranged over the upper surface 102u of the substrate 102. The dielectric structure 114 surrounds a first plurality of interconnects 116 and a second plurality of interconnects 118. The first plurality of interconnects 116 are electrically coupled to the second doped region 112. In some embodiments, the first plurality of interconnects 116 are coupled to the second doped region 112 by way of a second doped contact region 412 arranged along the upper surface 102u of the substrate 102. The second doped contact region 412 comprises a higher doping concentration than the second doped region 112, so as to reduce a contact resistance with the first plurality of interconnects 116. In some embodiments, the first plurality of interconnects 116 may comprise a first conductive contact 116a contacting the second doped contact region 412 and a first interconnect wire 116b over the first conductive contact 116a. The second plurality of interconnects 118 are electrically coupled to the first doped contact region 110. In some embodiments, the second plurality of interconnects 118 may comprise a second conductive contact 118a contacting the first doped contact region 110 and a second interconnect wire 118b over the second conductive contact 118a.

In some embodiments, the dielectric structure 114 comprises a plurality of stacked inter-level dielectric (ILD) layers 114a-114b. The plurality of stacked ILD layers 114a-114b laterally surround the first plurality of interconnects 116 and the second plurality of interconnects 118. In some embodiments, the plurality of stacked ILD layers 114a-114b may comprise one or more of silicon dioxide, SiCOH, a fluorosilicate glass, a phosphate glass (e.g., borophosphate silicate glass), or the like. In some embodiments, the first plurality of interconnects 116 and/or the second plurality of interconnects 118 may comprise a conductive metal such as copper, aluminum, and/or tungsten, for example. In some embodiments, two or more adjacent ones of the plurality of stacked ILD layers 114a-114b may be separated by an etch stop layer (not shown) comprising a nitride, a carbide, or the like.

Figure 4B:
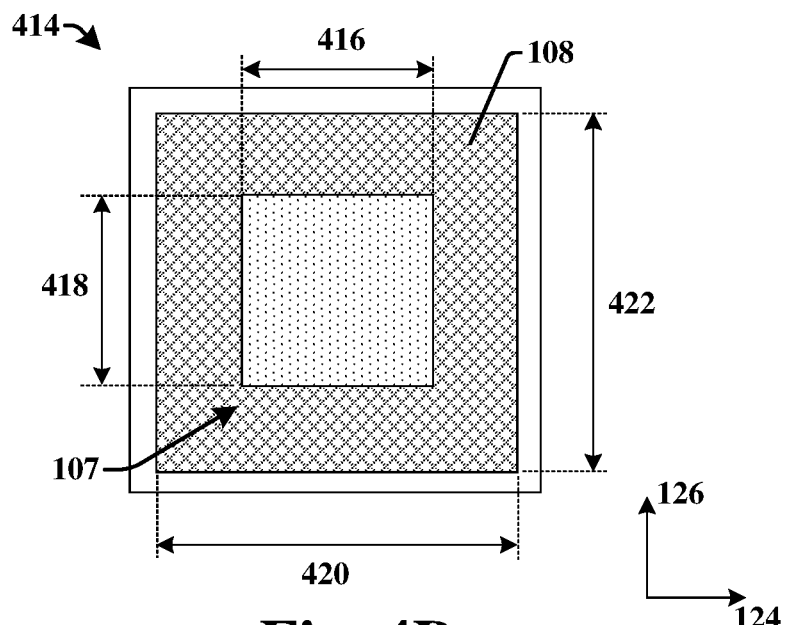

FIG. 4B illustrates a top-view 414 of the image sensor integrated chip of FIG. 4A taken along cross-sectional line A-A'.

As shown in top-view 414, the one or more channel openings 107 comprise a first width 416 extending in a first direction 124 and a first height 418 extending in a second direction 126 that is perpendicular to the first direction 124. The first width 416 and the first height 418 give the one or more channel openings 107 a first area that is approximately equal to the first width 416 multiplied by the first height 418. The second semiconductor material 108 comprises a second width 420 extending in the first direction 124 and a second height 422 extending in the second direction 126. The second width 420 and the second height 422 give the second semiconductor material 108 a second area that is approximately equal to the second width 420 multiplied by the second height 422. A ratio of the first area to the second area is in a range of greater than approximately 0% and approximately 100%, between greater than approximately 10% and less than approximately 80%, or other similar values.

Figure 5:
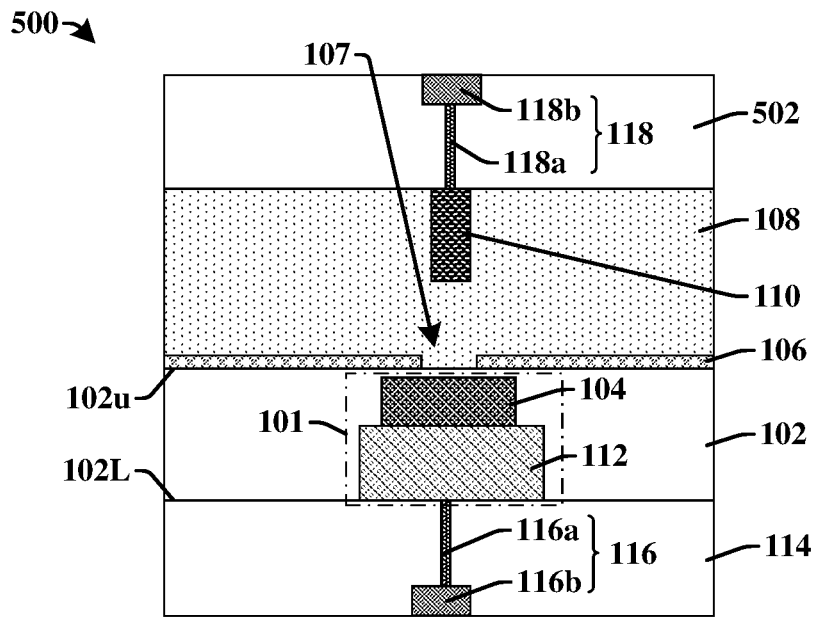
FIG. 5 illustrates a cross-sectional view of some alternative embodiments of an image sensor integrated chip comprising a patterned doped layer.

FIG. 5 illustrates a cross-sectional view of some embodiments of an image sensor integrated chip 500 comprising a disclosed patterned doped layer.

The image sensor integrated chip 500 comprises a photodiode region 101 disposed within a substrate 102. In some embodiments, the photodiode region 101 comprises a first doped region 104 and a second doped region 112 disposed below the first doped region 104. The first doped region 104 comprises a first doping type (e.g., p-type) and the second doped region 112 comprises a second doping type (e.g., n-type). A patterned doped layer 106 is arranged along an upper surface 102u of the substrate 102. In various embodiments, the patterned doped layer 106 may comprise a doped epitaxial layer on the substrate 102 or a doped region that is within the substrate 102. The patterned doped layer 106 comprises one or more sidewalls defining one or more channel openings 107 that are directly over the first doped region 104.

A second semiconductor material 108 is disposed on the patterned doped layer 106 and on the upper surface 102u of the substrate 102. A first doped contact region 110 is disposed along an upper surface of the second semiconductor material 108 and within the second semiconductor material 108. The first doped contact region 110 comprises the first doping type (e.g., p-type).

A dielectric structure 114 is arranged along the lower surface 102L of the substrate 102. The dielectric structure 114 surrounds a first plurality of interconnects 116 that are coupled to the second doped region 112. In some embodiments, the dielectric structure 114 may comprise a first plurality of stacked ILD layers. In some embodiments, the first plurality of interconnects 116 may comprise a first conductive contact 116a, an interconnect via, and/or a first interconnect wire 116b. An additional dielectric structure 502 is arranged along an upper surface of the second semiconductor material 108 that faces away from the substrate 102. The additional dielectric structure 502 surrounds a second plurality of interconnects 118 that are coupled to the first doped contact region 110. In some embodiments, the additional dielectric structure 502 may comprise a second plurality of stacked ILD layers. In some embodiments, the second plurality of interconnects 118 may comprise a second conductive contact 118a, a second interconnect via, and/or a second interconnect wire 118b.

Figure 6A:
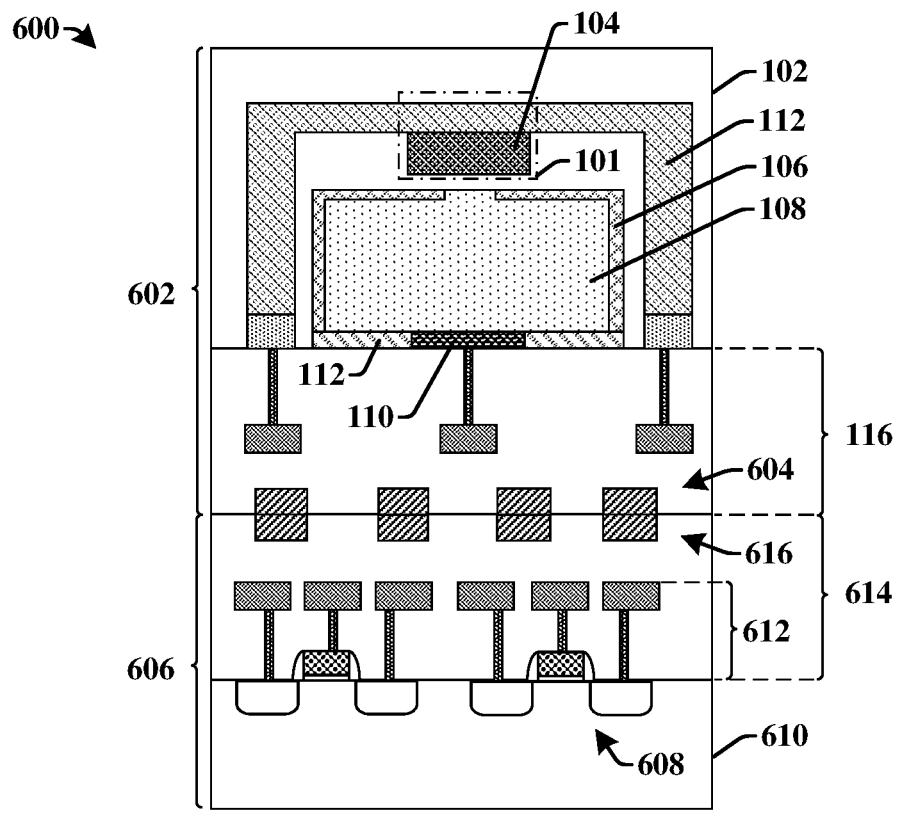
FIGS. 6A-6B illustrate cross-sectional views of some embodiments of multi-dimensional integrated chip structures comprising patterned doped layers.

FIG. 6A illustrates a cross-sectional view of some embodiments of a multi-dimensional integrated chip 600 comprising a disclosed patterned doped layer.

The multi-dimensional integrated chip 600 comprises an image sensor integrated chip (IC) die 602 comprising a photodiode region 101 disposed within a substrate 102. The photodiode region 101 comprises a second doped region 112 disposed within the substrate 102. A second semiconductor material 108 disposed within a recess in the substrate 102 over the photodiode region 101. A first doped contact region 110 is disposed along a surface of the second semiconductor material 108 that faces away from the substrate 102. The second doped region 112 is coupled to a first plurality of interconnects 116 within a dielectric structure 114 and the first doped contact region 110 is coupled to a second plurality of interconnects 118 within the dielectric structure 114. The first plurality of interconnects 116 and the second plurality of interconnects 118 are coupled to a first plurality of bonding structures 604 (e.g., bond pads).

The multi-dimensional integrated chip 600 further comprises an additional IC die 606. The additional IC die 606 comprises a plurality of semiconductor devices 608 disposed within an additional substrate 610. The plurality of semiconductor devices 608 may comprise transistor devices (e.g., a planar FET, a FinFET, a gate all around (GAA) device, a nanosheet device, or the like) coupled to a third plurality of additional interconnects 612 within an additional dielectric structure 614 over the additional substrate 610. In some embodiments, the plurality of semiconductor devices 608 may be part of a processor (e.g., a signal processing unit) configured to receive a signal from the image sensor IC die 602. The third plurality of additional interconnects 612 are coupled to a plurality of additional bonding structures 616 (e.g., bond pads) arranged on and/or within the additional dielectric structure 614.

The image sensor IC die 602 is bonded to the additional IC die 606 along a hybrid bonding interface, in which the first plurality of bonding structures 604 contact the plurality of additional bonding structures 616 along a conductive interface and the dielectric structure 114 contacts the additional dielectric structure 614 along a dielectric interface.

Figure 6B:
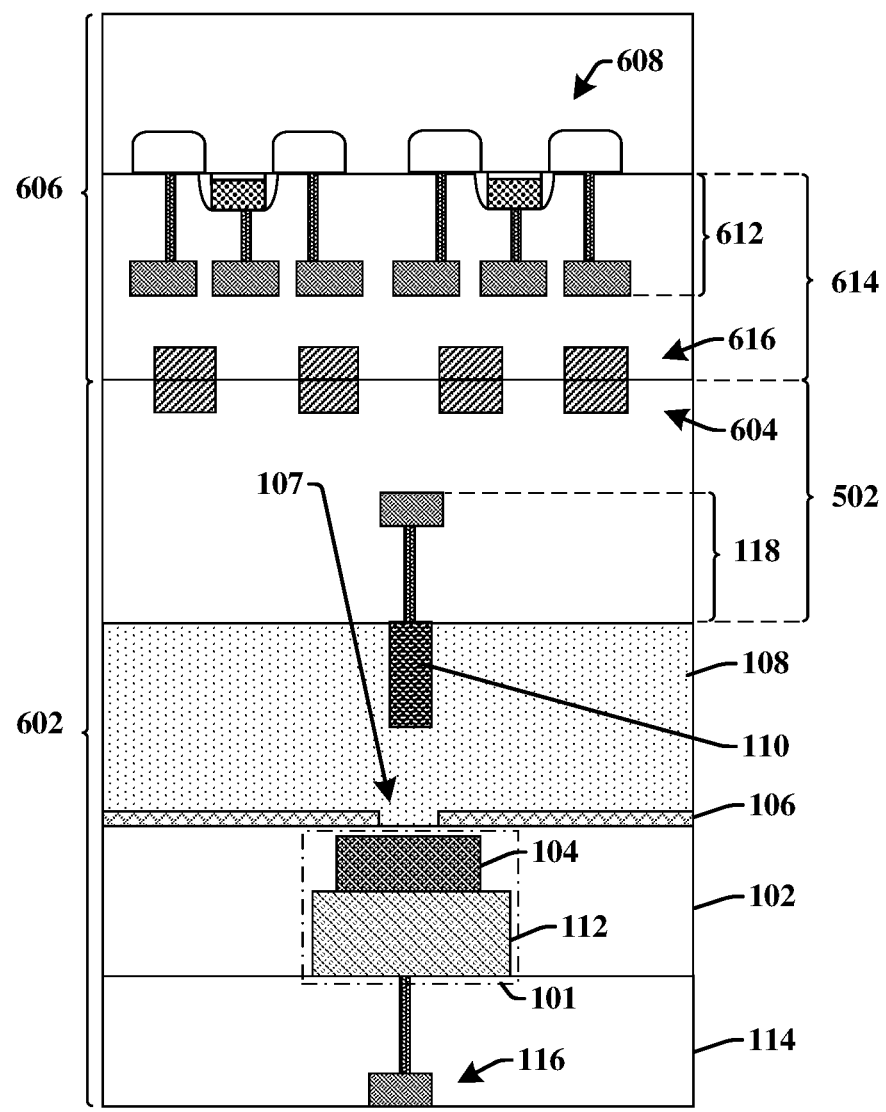

FIG. 6B illustrates a cross-sectional view of some additional embodiments of a multi-dimensional integrated chip 618 comprising a disclosed patterned doped layer.

The multi-dimensional integrated chip 618 comprises an image sensor IC die 602 having a photodiode region 101 disposed within a substrate 102. The photodiode region 101 comprises a second doped region 112 disposed within the substrate 102. A second semiconductor material 108 is disposed on the substrate 102. A first doped contact region 110 is disposed within the second semiconductor material 108. The second doped region 112 is coupled to a first plurality of interconnects 116 within a dielectric structure 114 and the first doped contact region 110 is coupled to a second plurality of interconnects 118 within an additional dielectric structure 502. The second plurality of interconnects 118 are coupled to a first plurality of bonding structures 604 (e.g., bond pads).

The multi-dimensional integrated chip 600 further comprises an additional IC die 606 bonded to the image sensor IC die 602 along a hybrid bonding interface, in which the first plurality of bonding structures 604 contact the plurality of additional bonding structures 616 along a conductive interface and the dielectric structure 114 contacts the additional dielectric structure 614 along a dielectric interface.

It will be appreciated that the disclosed image sensor integrated chips may be implemented in different types of integrated chip applications. In some embodiments, the disclosed image sensor integrated chips may be implemented in a short-wave infrared direct time-of-flight (SWIR dToF) sensor used in cell phones, automotive applications (e.g., LIDAR), or the like. The good performance (e.g., high sensitivity and/or photon detection efficiency) of the disclosed image sensor integrated chip in the short-wave infrared spectrum (e.g., for wavelength between approximately 1.3 and approximately 1.5 microns, between approximately 1.4 microns and approximately 3 microns, or other similar values) provides the SWIR dToF with a good performance.

Figure 7:
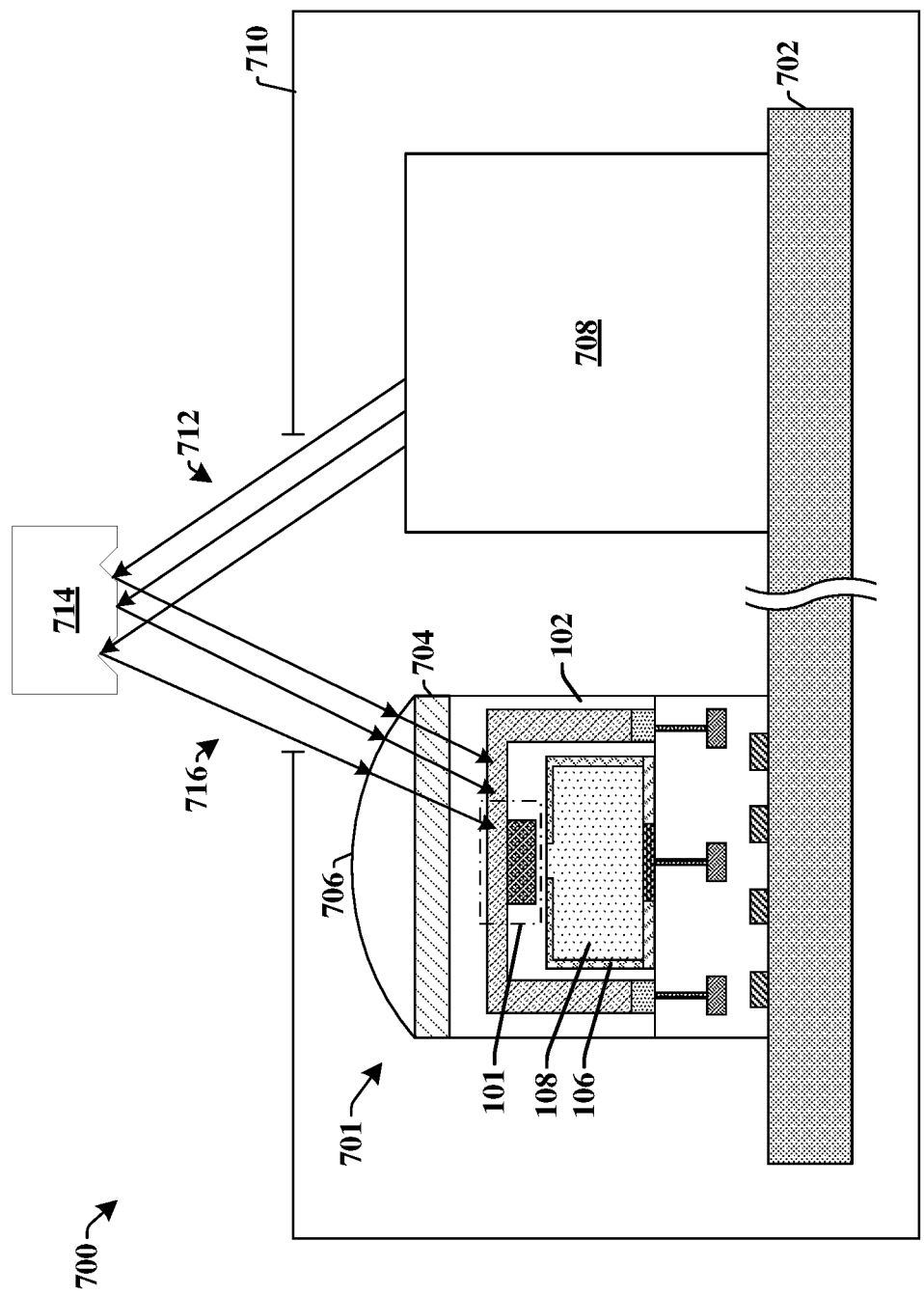
FIG. 7 illustrates a cross-sectional view of an integrated chip structure comprising a short-wave infrared sensor direct time-of-flight (SWIR dToF) sensor including a patterned doped layer.

FIG. 7 illustrates a cross-sectional view of an integrated chip structure 700 comprising SWIR dToF sensor having a disclosed photodiode structure.

The integrated chip structure 700 comprises a first IC die 701 coupled to a base substrate 702. In various embodiments, the base substrate 702 may comprise an interposer substrate, a package substrate, a printed circuit board, or the like. The first IC die 701 comprises a photodiode region 101 disposed within a substrate 102. A second semiconductor material 108 is separated from the substrate 102 by a patterned doped layer 106.

In some embodiments, one or more color filters 704 are arranged on the substrate 102. The one or more color filters 704 are configured to transmit specific wavelengths of incident radiation. For example, a first color filter of the one or more color filters 704 may be configured to transmit radiation having wavelengths within a first range (e.g., corresponding to green light), while reflecting radiation having wavelengths within a second range (e.g., corresponding to red light) different than the first range, etc. One or more micro-lenses 706 are disposed on the one or more color filters 704. The one or more micro-lenses 706 are configured to focus radiation towards the photodiode region 101.

An illumination integrated chip 708 is also disposed on the base substrate 702. In some embodiments, the illumination integrated chip 708 may comprise a light emitting diode, a VCSEL (vertical cavity surface emitting laser), or the like. In some embodiments, a package 710 surrounds the first IC die 701 and the illumination integrated chip 708.

During operation, the illumination integrated chip 708 is configured to generate illuminating electromagnetic radiation 712 (e.g., NIR radiation). The illuminating electromagnetic radiation 712 may bounce off of a target object 714 and reflect back towards the first IC die 701 as reflected electromagnetic radiation 716. The first IC die 701 is configured to detect the reflected electromagnetic radiation 716 and generate a signal therefrom. A processing integrated chip (not shown) is configured to process the signal (e.g., to determine a distance to the target object 714).

FIGS. 8-20 illustrate cross-sectional views 800-2000 of some embodiments of a method of forming an image sensor integrated chip comprising a disclosed patterned doped layer. Although FIGS. 8-20 are described in relation to a method, it will be appreciated that the structures disclosed in FIGS. 8-20 are not limited to such a method, but instead may stand alone as structures independent of the method. Furthermore, it will be appreciated that the structures illustrated in FIGS. 1-7 may be formed within alternative embodiments of the method shown in FIGS. 8-20.

Figure 8:
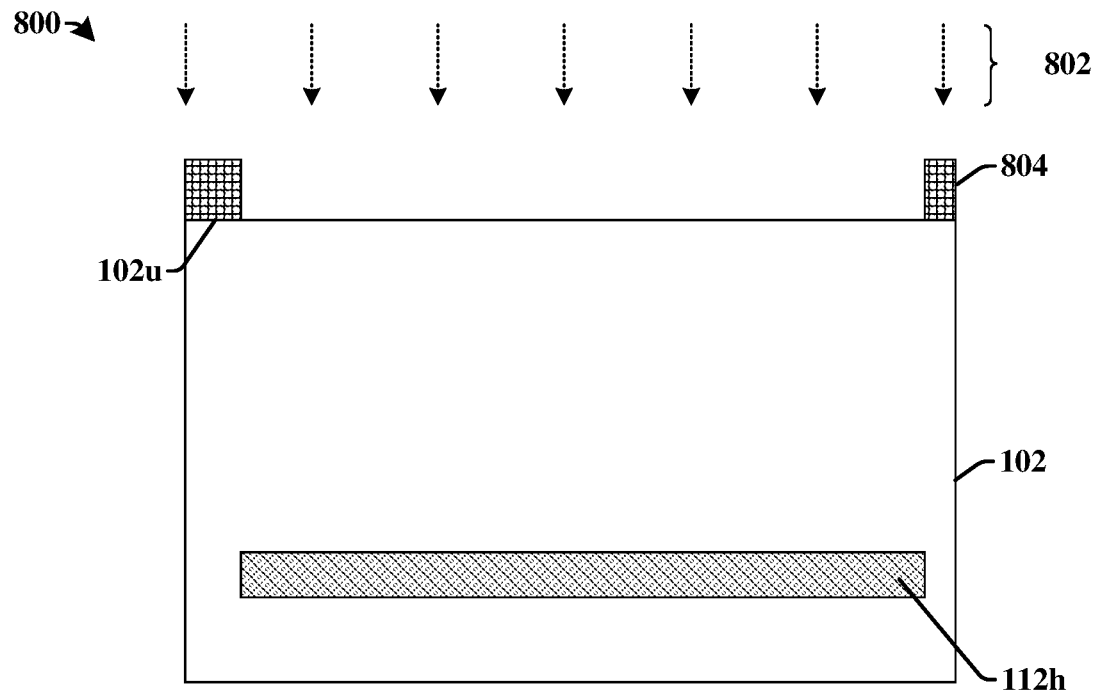
FIGS. 8-20 illustrate some embodiments of a method of forming an image sensor integrated chip comprising a patterned doped layer.

As shown in cross-sectional view 800 of FIG. 8, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments (not shown), one or more semiconductor devices are formed on and/or within the substrate 102.

As shown in cross-sectional view 800 of FIG. 8, a horizontally extending second doped region 112h is formed within the substrate 102. The horizontally extending second doped region 112h is vertically separated from an upper surface 102u of the substrate 102 by a non-zero distance. The horizontally extending second doped region 112h is formed to laterally extend from a first end to an opposing second end. In some embodiments, the horizontally extending second doped region 112h may be formed by selectively implanting a first dopant species 802 into the substrate 102 according to a first mask 804. In various embodiments, the first mask 804 may comprise an oxide, a photoresist, or other similar materials. In some embodiments, the first mask 804 may be formed onto the upper surface 102u of the substrate 102 and the first dopant species 802 may be selectively implanted into the upper surface 102u of the substrate 102. In various embodiments, the first dopant species 802 may comprise arsenic, phosphorus, or the like.

Figure 9:
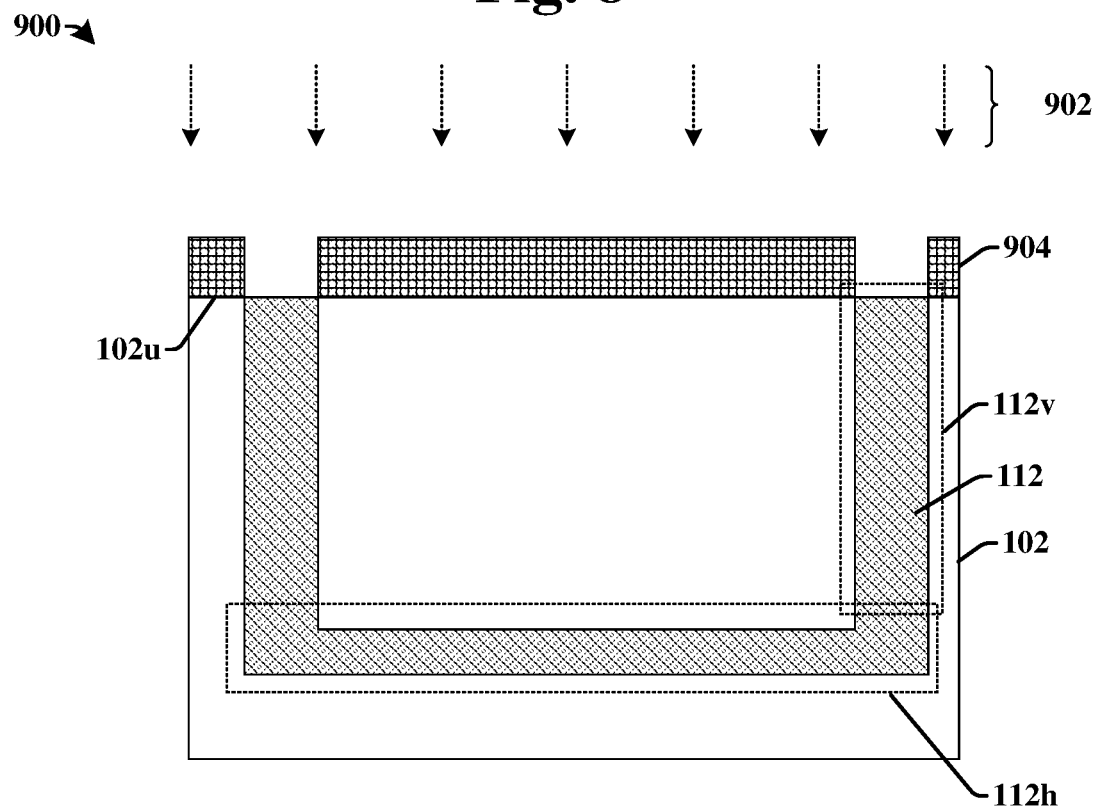

As shown in cross-sectional view 900 of FIG. 9, a vertically extending second doped region 112v is formed within the substrate 102. The vertically extending second doped region 112v vertically extends from the horizontally extending second doped region 112h to the upper surface 102u of the substrate 102 to form a second doped region 112. In some embodiments, the vertically extending second doped region 112v may be formed by selectively implanting a second dopant species 902 into the substrate 102 according to a second mask 904. In various embodiments, the second mask 904 may comprise an oxide, a photoresist, or other similar materials. In some embodiments, the second mask 904 may be formed onto the upper surface 102u of the substrate 102 and the second dopant species 902 may be selectively implanted into the upper surface 102u of the substrate 102. In various embodiments, the second dopant species 902 may comprise arsenic, phosphorus, or the like.

Figure 10:
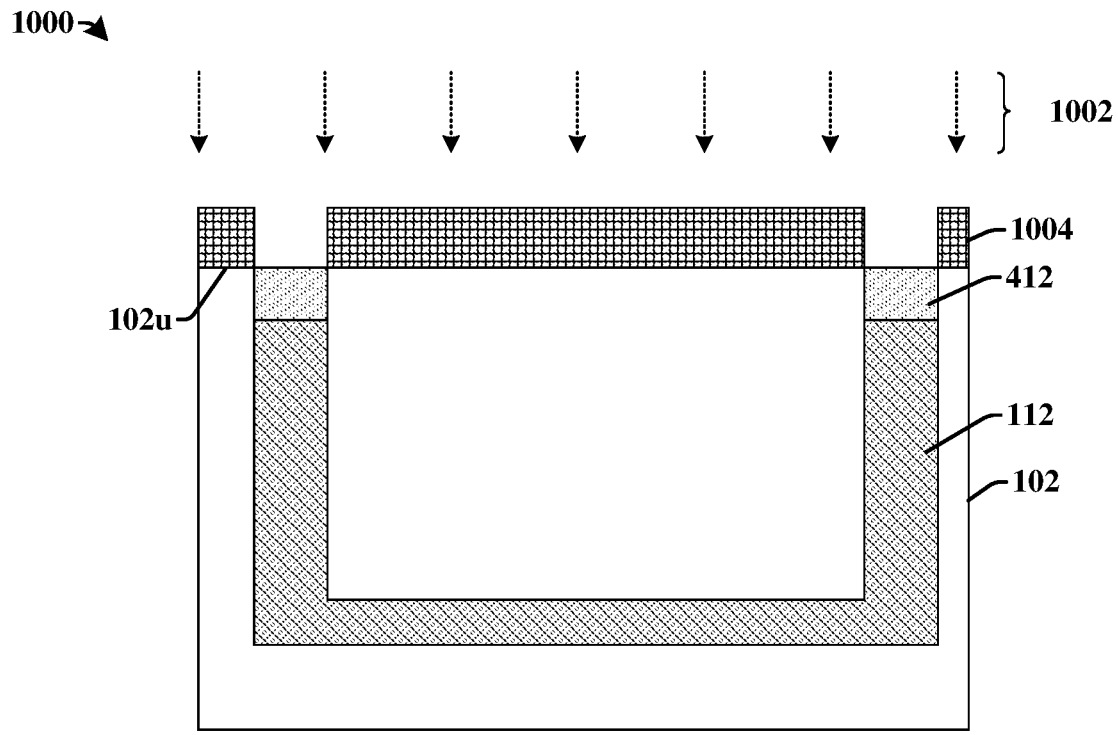

As shown in cross-sectional view 1000 of FIG. 10, a second doped contact region 412 is formed within the substrate 102 along a top of the vertically extending second doped region 112v and along the upper surface 102u of the substrate 102. The second doped contact region 412 comprises a higher doping concentration than the second doped region 112, so as to reduce a contact resistance with overlying interconnects. In some embodiments, the second doped contact region 412 may be formed by selectively implanting a third dopant species 1002 into the substrate 102 according to a third mask 1004. In various embodiments, the third mask 1004 may comprise an oxide, a photoresist, or other similar materials. In various embodiments, the third dopant species 1002 may comprise arsenic, phosphorus, or the like.

Figure 11:
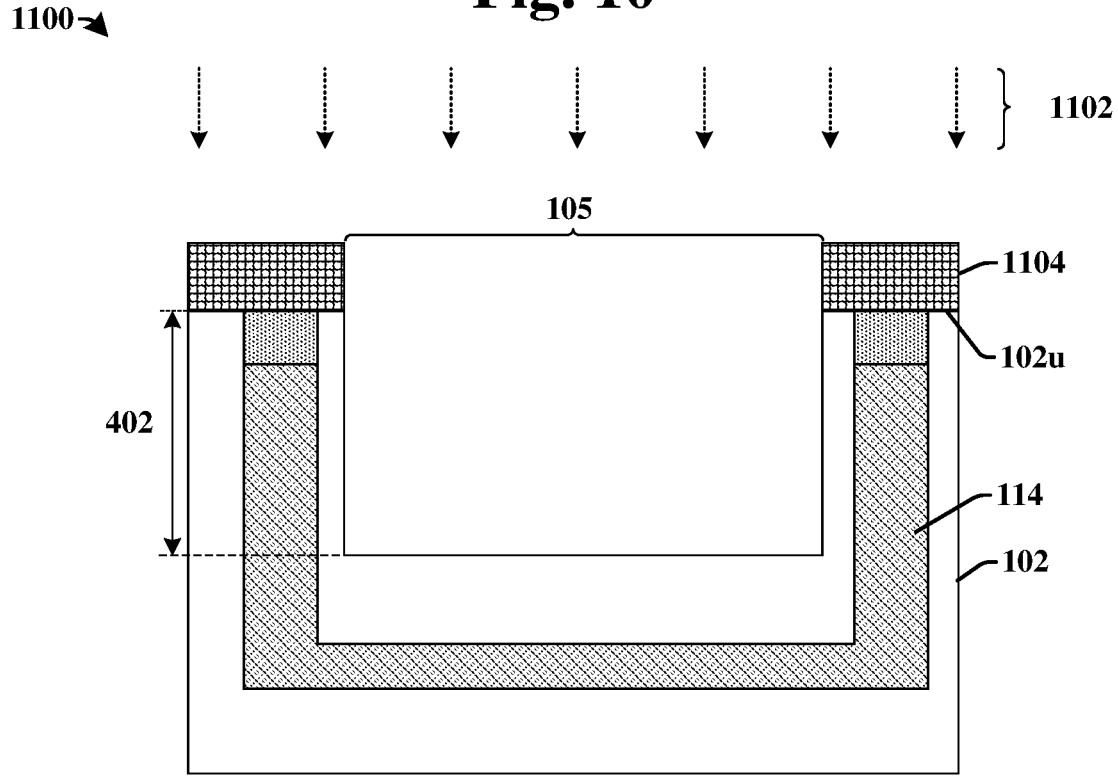

As shown in cross-sectional view 1100 of FIG. 11, the substrate 102 is selectively etched according to a first patterning process to form a recess 105 within the upper surface 102u of the substrate 102. In some embodiments, the first patterning process may be performed by selectively exposing the substrate 102 to a first etchant 1102 according to a fourth mask 1104. The first patterning process forms one or more sidewalls of the substrate 102 and a horizontally extending surface of the substrate 102, which define the recess 105. In some embodiments, the first etchant 1102 may comprise a dry etchant (e.g., a plasma etchant having a fluorine based etching chemistry, a $SF_6$ plasma, or the like) or a wet etchant. In some embodiments, the fourth mask 1104 may comprise a photosensitive material (e.g., a photoresist), a hard mask, or the like. The recess 105 is formed to extend to a first depth 402 into the substrate 102. In some embodiments, the first depth 402 may be in a range of between approximately 0 μm and approximately 5 μm, between approximately 0 μm and approximately 3 μm, between approximately 1 μm and approximately 3 μm, or other similar values As shown in cross-sectional view 1200 of FIG. 12, a first doped region 104 is formed within the substrate 102. In some embodiments, the first doped region 104 may be formed by selectively implanting a fourth dopant species 1202 into the substrate 102 according to a fifth mask 1204. The first doped region 104 may be formed to contact the second doped region 112, so as to form a photodiode region 101 within the substrate 102. In various embodiments, the fifth mask 1204 may comprise an oxide, a photoresist, or other similar materials. In various embodiments the fourth dopant species 1202 may comprise boron, gallium, aluminum, or the like.

Figure 13:
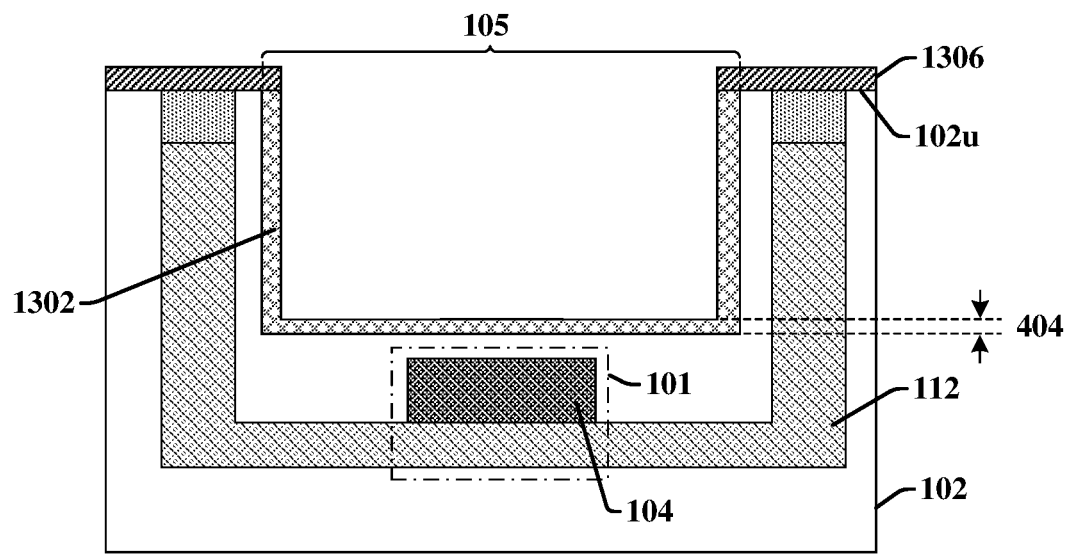

As shown in cross-sectional view 1300 of FIG. 13, a doped layer 1302 is formed along the one or more sidewalls and the horizontally extending surface of the substrate 102. The doped layer 1302 is configured to pacify defects (e.g., traps) that may form along the one or more sidewalls and the horizontally extending surface of the substrate 102. In some embodiments, the doped layer 1302 may be formed to a thickness 404 that is in a range of between approximately 0 Å and approximately 500 Å, between approximately 10 Å and approximately 400 Å, between approximately 100 Å and approximately 300 Å, or other similar values.

In some embodiments, the doped layer 1302 may be formed by a selective epitaxial growth process. The selective epitaxial growth process forms the doped layer 1302 along the one or more sidewalls and the horizontally extending surface of the substrate 102. The selective epitaxial growth process may form the doped layer 1302 to have a thickness 404 that is substantially uniform along the one or more sidewalls and the horizontally extending surface of the substrate 102. In some embodiments, a first sacrificial dielectric 1306 is formed onto the upper surface 102u of the substrate 102 prior to the selective epitaxial growth process. The first sacrificial dielectric 1306 blocks formation of the doped layer 1302, so that the doped layer 1302 is confined to within the recess 105. In some embodiments, the first sacrificial dielectric 1306 may comprise an oxide (e.g., silicon oxide), a nitride (e.g., silicon nitride), silicon carbide (e.g., silicon carbide), or the like.

In other embodiments, the doped layer 1302 may be formed by selectively implanting a fifth dopant species into the substrate 102. In some embodiments, a high temperature anneal may be performed after the implantation process to diffuse the fifth dopant species into the substrate 102. In some embodiments, the fifth dopant species may comprise boron, gallium, aluminum, or the like. In some embodiments, the high temperature anneal may be performed at a temperature of greater than approximately 750° C., greater than approximately 900° C., greater than approximately 1000° C., or other similar values. In some such embodiments, the doped layer 1302 may be formed by implanting the fifth dopant species into the substrate 102 according to the first sacrificial dielectric 1306. The implantation process may form the doped layer 1302 to have a smaller thickness along the one or more sidewalls than along the horizontally extending surface of the substrate 102.

Figure 14:
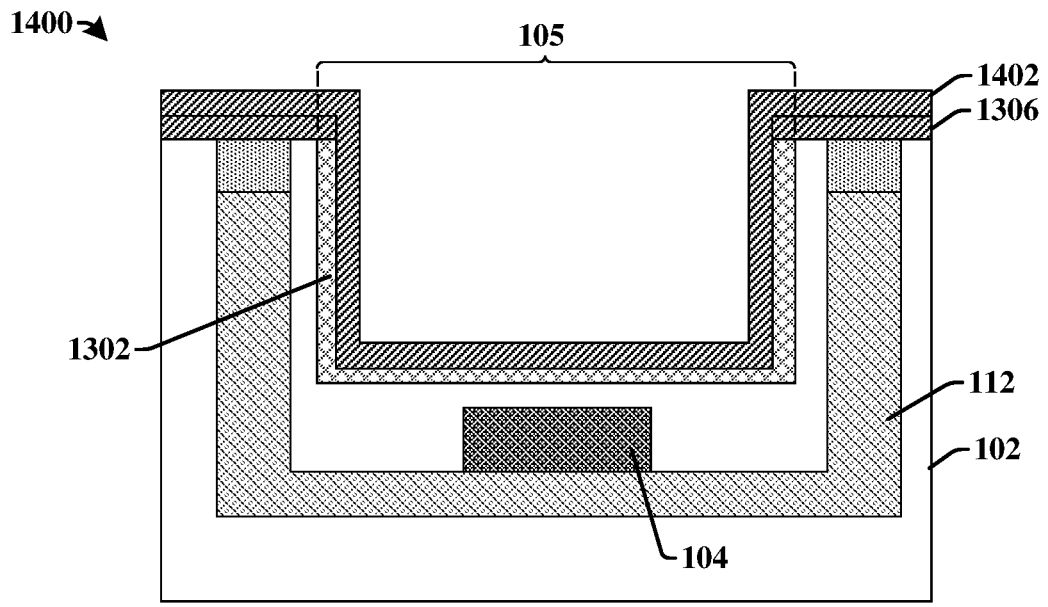

As shown in cross-sectional view 1400 of FIG. 14, a second sacrificial dielectric 1402 is formed onto the doped layer 1302 and the first sacrificial dielectric 1306. In some embodiments, the second sacrificial dielectric 1402 may comprise an oxide (e.g., silicon oxide), a nitride (e.g., silicon nitride), silicon carbide (e.g., silicon carbide), or the like. In some embodiments, the second sacrificial dielectric 1402 may be formed by one or more deposition processes (e.g., a PVD process, a CVD process, a PE-CVD process, a high-density IMP deposition, a high-density ICP deposition, a sputtering process, a LP-CVD, or the like).

Figure 15:
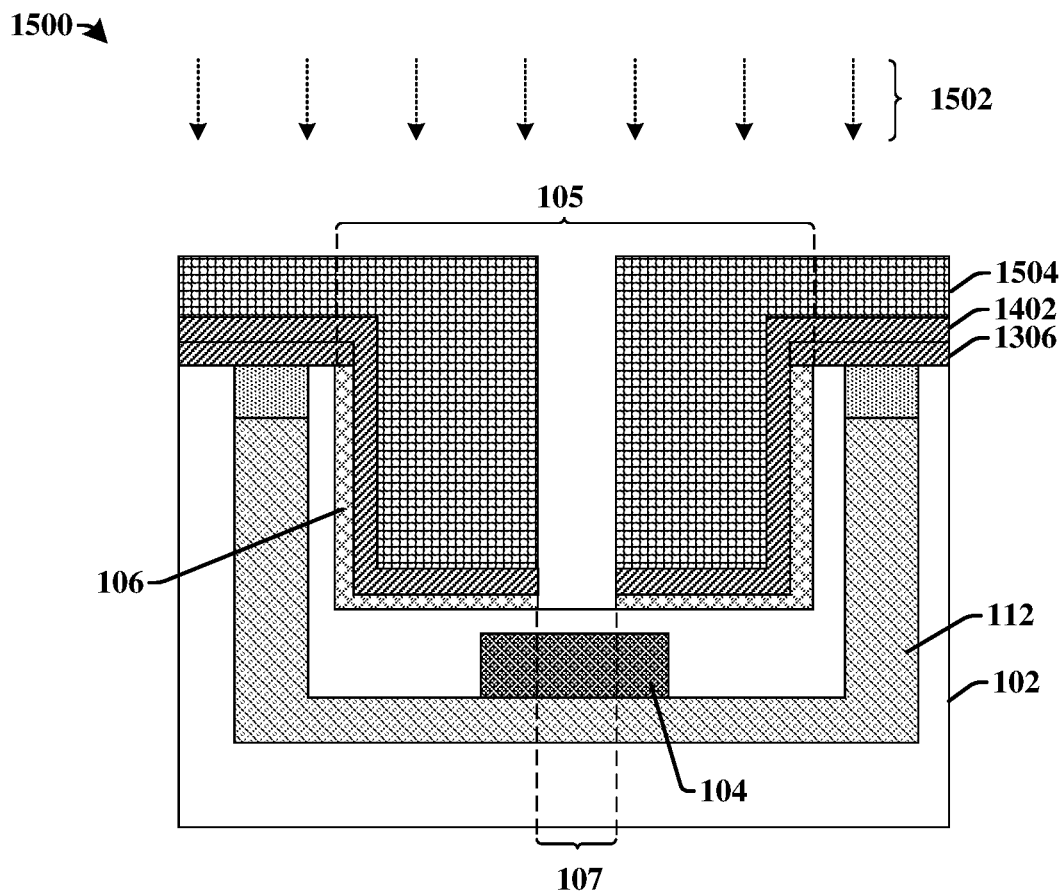

As shown in cross-sectional view 1500 of FIG. 15, the doped layer (e.g., 1302 of FIG. 14) is selectively etched according to a second patterning process to form one or more channel openings 107 extending through a patterned doped layer 106. In some embodiments, the one or more channel openings 107 may extend into the substrate 102, so that the one or more channel openings 107 are defined by sidewalls of both the patterned doped layer 106 and the substrate 102.

In some embodiments, the second patterning process may be performed by selectively exposing the doped layer (e.g., 1302 of FIG. 14) and the second sacrificial dielectric 1402 to a second etchant 1502 according to a sixth mask 1504. The second sacrificial dielectric 1402 separates the doped layer from the sixth mask 1504. By separating the doped layer from the sixth mask 1504, the second sacrificial dielectric 1402 can prevent damage and/or contamination of the patterned doped layer 106 that could lead to increased leakage currents within the image sensor integrated chip. In some embodiments, the second etchant 1502 may comprise a dry etchant (e.g., a plasma etchant having a fluorine based etching chemistry, a $SF_6$ plasma, or the like) or a wet etchant (e.g., hydrofluoric acid (HF), potassium hydroxide (KOH), piranha etch, or the like). In some embodiments, the sixth mask 1504 may comprise a photosensitive material (e.g., a photoresist), a hard mask, or the like.

Figure 16:
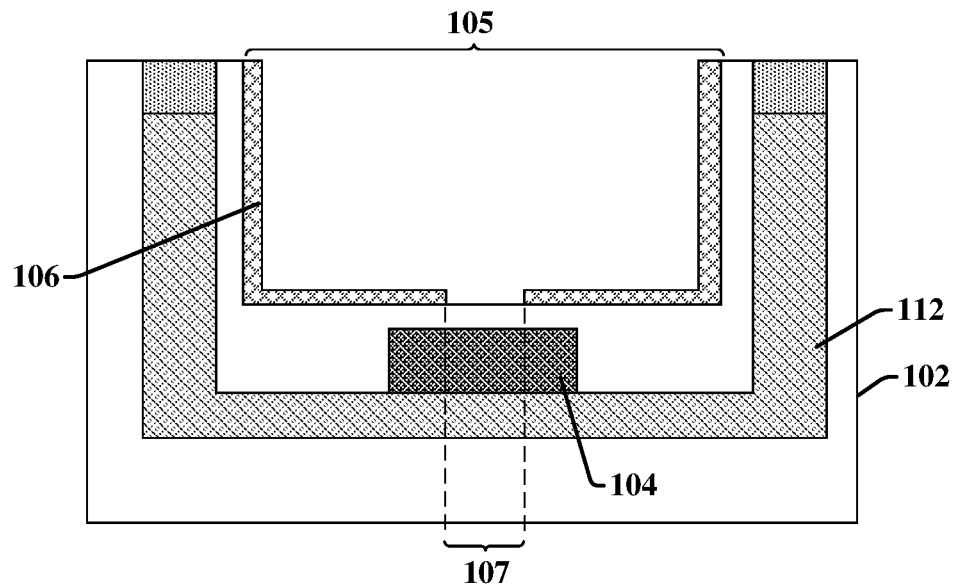

As shown in cross-sectional view 1600 of FIG. 16, the first sacrificial dielectric and the second sacrificial dielectric are removed. In various embodiments, the first sacrificial dielectric and the second sacrificial dielectric may be removed by a planarization process (e.g., a chemical mechanical planarization (CMP) process), an etching process, or the like.

Figure 17:
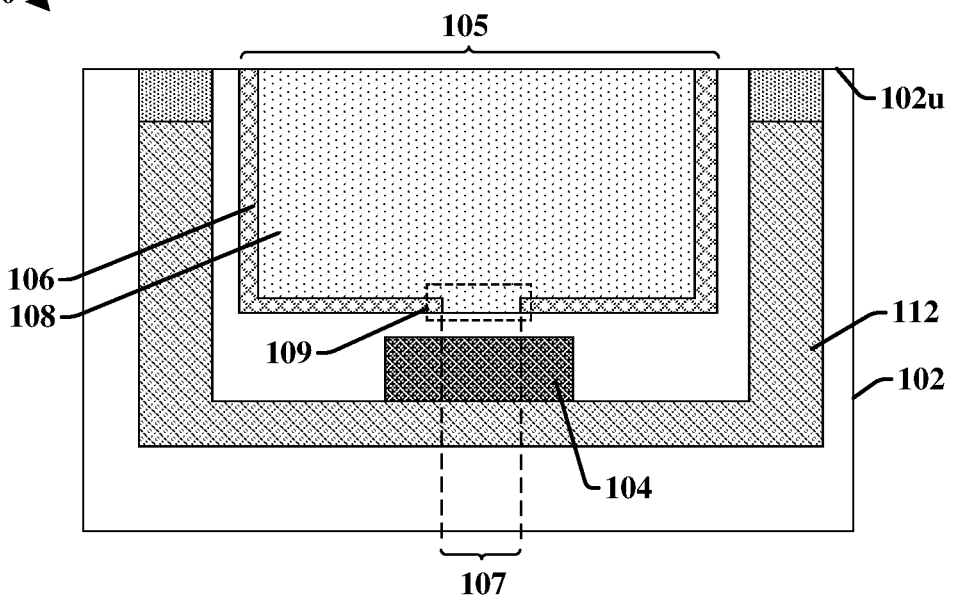

As shown in cross-sectional view 1700 of FIG. 17, a second semiconductor material 108 is formed within the recess 105 and on the patterned doped layer 106. The second semiconductor material 108 is formed to have a protrusion 109 that extends through the one or more channel openings 107 to contact the substrate 102 at or below a bottom of the patterned doped layer 106. In some embodiments, the second semiconductor material 108 may be formed by way of a deposition process (e.g., a PVD process, a CVD process, a PE-CVD process, a high-density ionized metal plasma (IMP) deposition, a high-density inductively coupled plasma (ICP) deposition, a sputtering process, a low-pressure chemical vapor deposition (LP-CVD), or the like). In some embodiments, a planarization process (e.g., a CMP process) may be performed after forming the second semiconductor material 108 within the recess 105 to remove excess of the second semiconductor material from over the upper surface 102u of the substrate 102.

Figure 18:
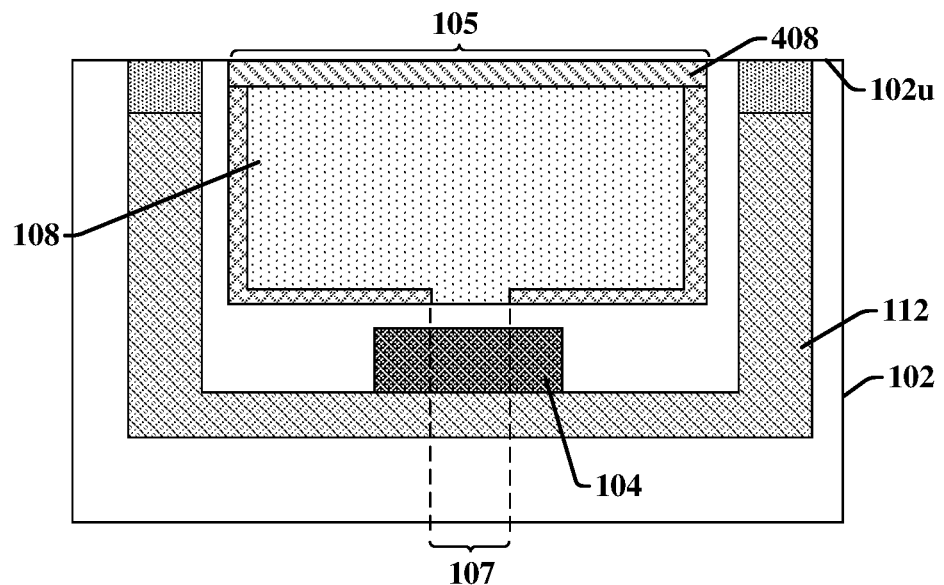

As shown in cross-sectional view 1800 of FIG. 18, a capping layer 408 is formed onto the second semiconductor material 108. In some embodiments, the capping layer 408 may be formed by recessing the second semiconductor material 108 to a non-zero distance below the upper surface 102u of the substrate 102. A capping semiconductor material is subsequently formed onto the second semiconductor material 108, followed by a planarization process (e.g., a chemical mechanical planarization (CMP) process) that removes excess of the capping semiconductor material from over the upper surface 102u of the substrate 102 to define the capping layer 408. In some embodiments, the capping semiconductor material may comprise silicon formed by a deposition process (e.g., a PVD process, a CVD process, a PE-CVD process, a high-density IMP deposition, a high-density ICP deposition, a sputtering process, a LP-CVD, or the like).

Figure 19:
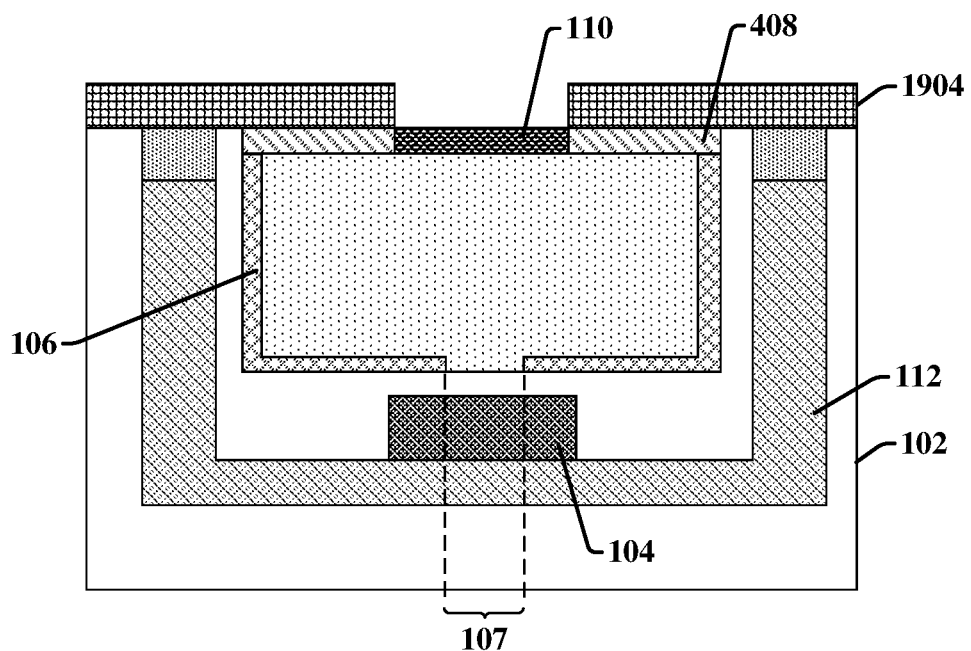

As shown in cross-sectional view 1900 of FIG. 19, a first doped contact region 110 is formed within the capping layer 408. In some embodiments, the first doped contact region 110 may be formed by selectively implanting a sixth dopant species 1902 into the capping layer 408 according to a seventh mask 1904. In some embodiments, the first doped contact region 110 may extend to within the second semiconductor material 108. In various embodiments, the seventh mask 1904 may comprise an oxide, a photoresist, or other similar materials. In some embodiments, the sixth dopant species 1902 may comprise gallium, boron, or the like.

Figure 20:
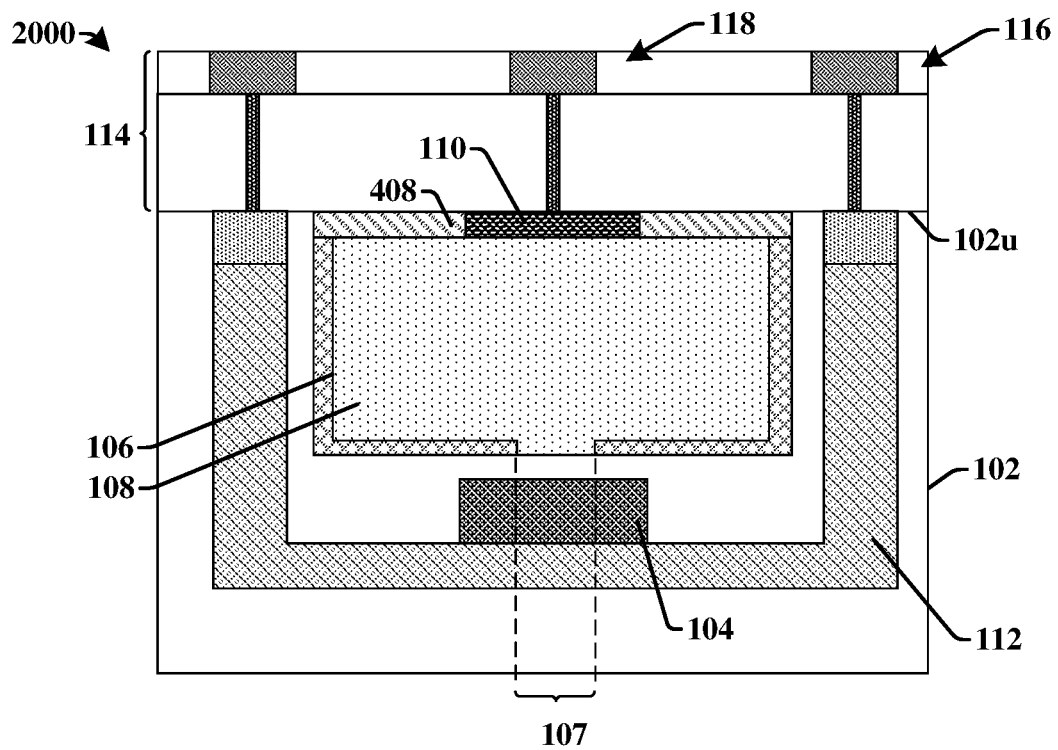

As shown in cross-sectional view 2000 of FIG. 20, a dielectric structure 114 is formed over the upper surface 102u of the substrate 102. In some embodiments, the dielectric structure 114 may be formed by one or more deposition processes (e.g., a PVD process, a CVD process, a PE-CVD process, a high-density IMP deposition, a high-density ICP deposition, a sputtering process, a LP-CVD process, or the like). In various embodiments, the dielectric structure 114 may comprise silicon dioxide, carbon doped silicon dioxide, silicon oxynitride, BSG, PSG, BPSG, FSG, a porous dielectric material (e.g., porous carbon doped silicon dioxide), or the like.

A first plurality of interconnects 116 and a second plurality of interconnects 118 are formed within the dielectric structure 114. The first plurality of interconnects 116 are coupled to the second doped region 112 by way of the second doped contact region 412 and the second plurality of interconnects 118 are coupled to the first doped contact region 110. In some embodiments, the first plurality of interconnects 116 and/or the second plurality of interconnects 118 may comprise a conductive contact, an interconnect via, and/or an interconnect wire. In some embodiments, the first plurality of interconnects 116 and the second plurality of interconnects 118 may be concurrently formed by selectively etching the dielectric structure 114 to define via holes and/or trenches within the dielectric structure 114, forming a conductive material (e.g., copper, aluminum, etc.) within the via holes and/or trenches, and performing a planarization process (e.g., a chemical mechanical planarization process). In some embodiments, the planarization process may comprise a CMP process.

FIGS. 21-31 illustrate cross-sectional views 2100-3100 of some alternative embodiments of a method of forming an image sensor integrated chip comprising a disclosed patterned doped layer. Although FIGS. 21-31 are described in relation to a method, it will be appreciated that the structures disclosed in FIGS. 21-31 are not limited to such a method, but instead may stand alone as structures independent of the method. Furthermore, it will be appreciated that the structures illustrated in FIGS. 1-7 may be formed within alternative embodiments of the method shown in FIGS. 21-31.

Figure 21:
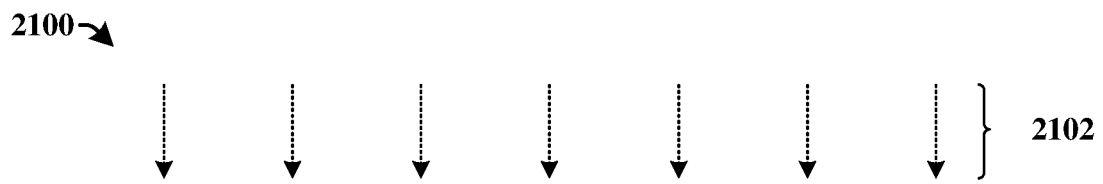
FIGS. 21-31 illustrate some alternative embodiments of a method of forming an image sensor integrated chip comprising a patterned doped layer.
Figure 21:
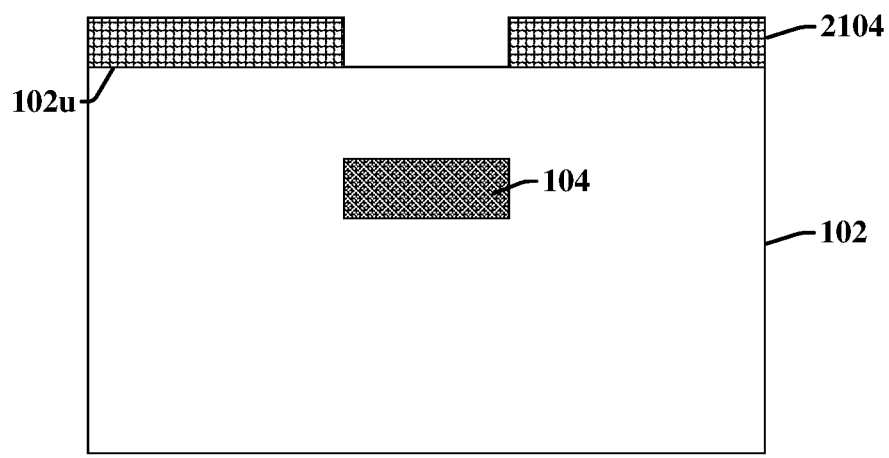

As shown in cross-sectional view 2100 of FIG. 21, a first doped region 104 is formed within the substrate 102. In some embodiments, the first doped region 104 may be formed by selectively implanting a first dopant species 2102 into the substrate 102 according to a first mask 2104.

Figure 22:
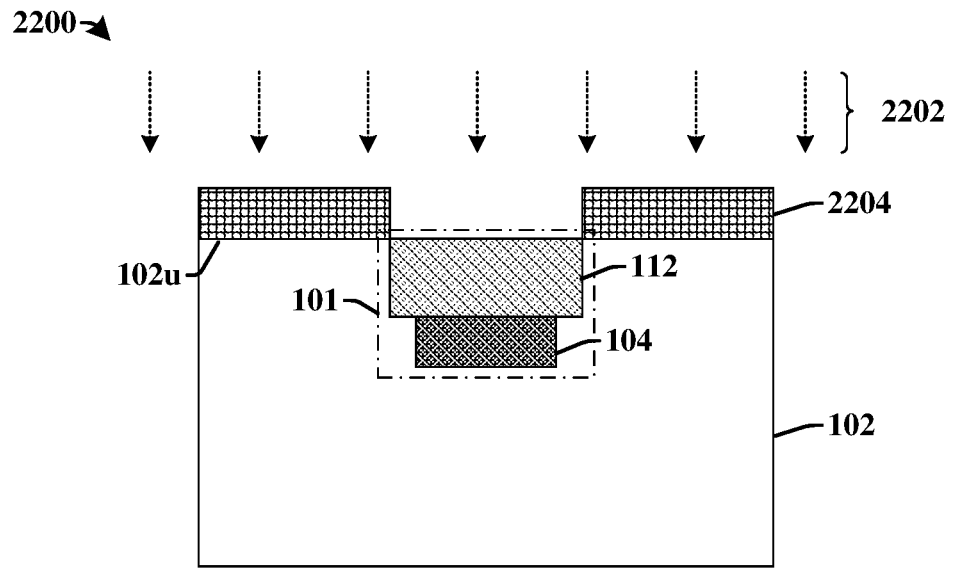

As shown in cross-sectional view 2200 of FIG. 22, a second doped region 112 is formed within the substrate 102. The second doped region 112 is vertically separated from an upper surface 102u of the substrate 102 by a non-zero distance. The second doped region 112 may be formed to contact the first doped region 104, so as to form a photodiode region 101 within the substrate 102. In some embodiments, the second doped region 112 may be formed by selectively implanting a second dopant species 2202 into the substrate 102 according to a second mask 2204.

Figure 23:
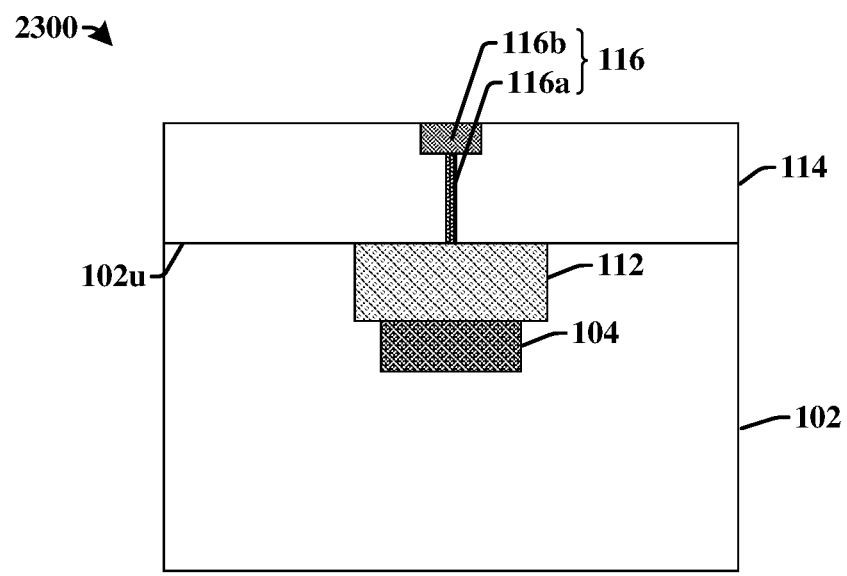

As shown in cross-sectional view 2300 of FIG. 23, a dielectric structure 114 is formed an upper surface 102u of the substrate 102. In some embodiments, the dielectric structure 114 may be formed by one or more deposition processes (e.g., a PVD process, a CVD process, a PE-CVD process, a high-density IMP deposition, a high-density ICP deposition, a sputtering process, a LP-CVD process, or the like). A first plurality of interconnects 116 are formed within the dielectric structure 114. The first plurality of interconnects 116 are formed to be in contact with the second doped region 112. In some embodiments, the first plurality of interconnects 116 may comprise a first conductive contact 116a and a first interconnect wire 116b.

Figure 24:
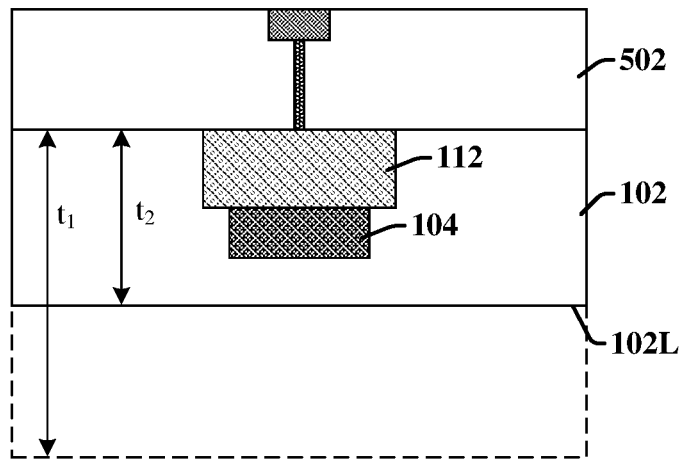

As shown in cross-sectional view 2400 of FIG. 24, the substrate 102 may be thinned to reduce a thickness of the substrate 102. In various embodiments, the substrate 102 may be thinned by etching and/or mechanical grinding a lower surface 102L of the substrate 102 to reduce the thickness of the substrate 102 from a first thickness $t_1$ to a second thickness $t_2$. In some embodiments, the first thickness $t_1$ may be in a range of between approximately 700 μm and approximately 800 μm. In some embodiments, the second thickness $t_2$ may be in a range of between approximately 20 μm and approximately 80 μm.

Figure 25:
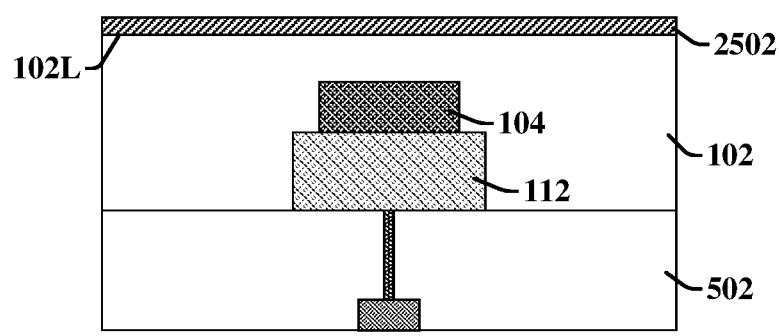

As shown in cross-sectional view 2500 of FIG. 25, a sacrificial dielectric 2502 is formed onto the lower surface 102L of the substrate 102. In some embodiments, the sacrificial dielectric 2502 may comprise an oxide (e.g., silicon oxide), a nitride (e.g., silicon nitride), silicon carbide (e.g., silicon carbide), or the like.

Figure 26:
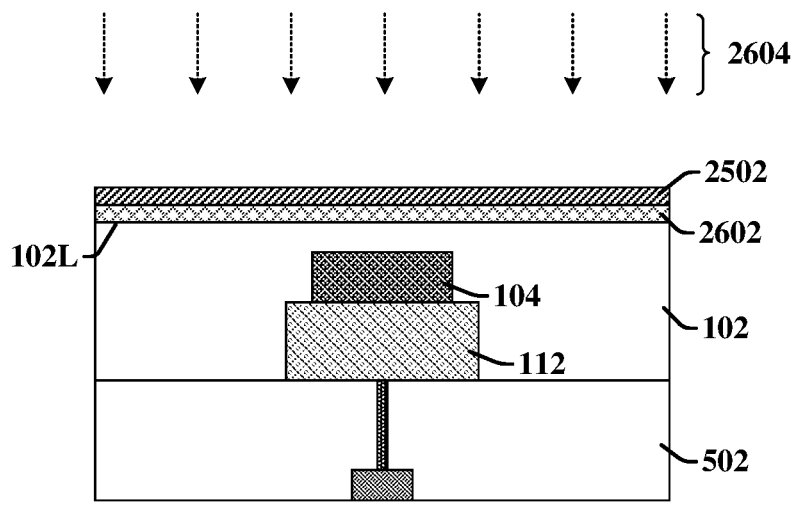

As shown in cross-sectional view 2600 of FIG. 26, a doped layer 2602 is formed along the lower surface 102L of the substrate 102. The doped layer 2602 is configured to pacify defects (e.g., traps) that may form along the lower surface 102L of the substrate 102 during thinning of the substrate 102 (e.g., shown in FIG. 23). In some embodiments, the doped layer 2602 may be formed by implanting a third dopant species 2604 into the lower surface 102L of the substrate 102. In other embodiments, the doped layer 2602 may be formed by a selective epitaxial growth process. In such embodiments, the doped layer 1302 may be formed prior to forming the sacrificial dielectric 2502.

Figure 27:
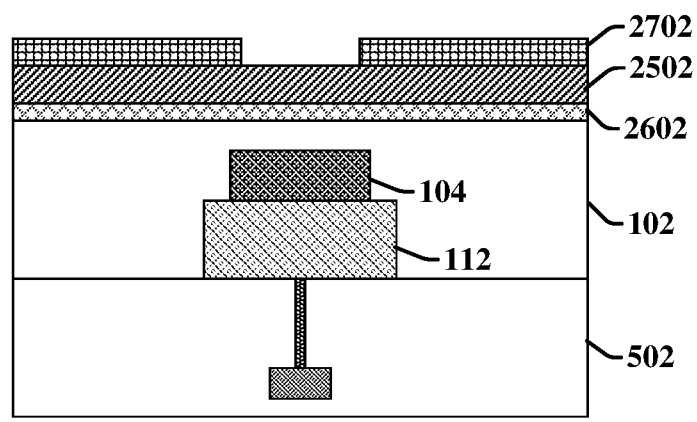

As shown in cross-sectional view 2700 of FIG. 27, a third mask 2702 is formed onto the sacrificial dielectric 2502. By separating the doped layer 2602 from the third mask 2702, the sacrificial dielectric 2502 can prevent damage and/or contamination of the doped layer 2602 that could lead to increased leakage currents within the image sensor integrated chip.

Figure 28:
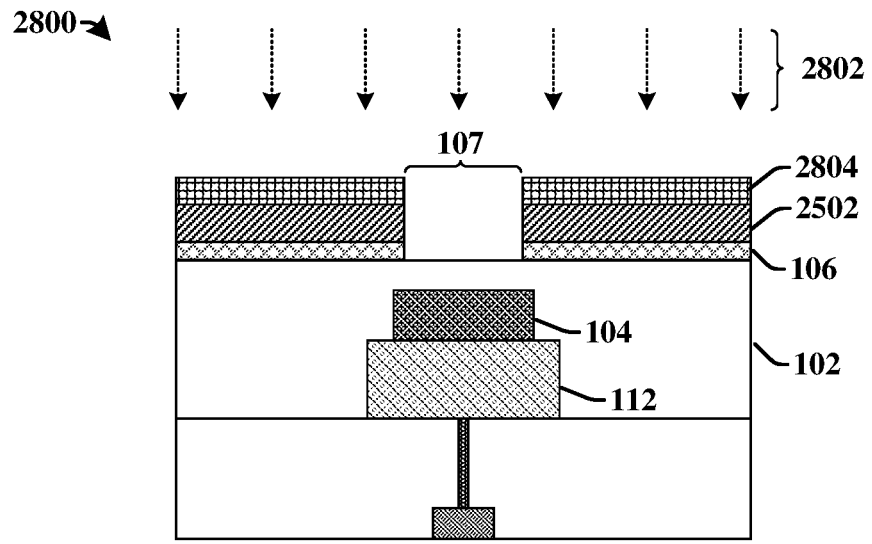

As shown in cross-sectional view 2800 of FIG. 28, the doped layer (e.g., 2602 of FIG. 26) is selectively etched according to a first patterning process to form one or more channel openings 107 extending through a patterned doped layer 106. In some embodiments, the one or more channel openings 107 may extend into the substrate 102, so that the one or more channel openings 107 are defined by sidewalls of both the patterned doped layer 106 and the substrate 102. In some embodiments, the first patterning process may be performed by selectively exposing the doped layer to a first etchant 2802 according to a fourth mask 2804. In some embodiments, the first etchant 2802 may comprise a dry etchant (e.g., a plasma etchant having a fluorine based etching chemistry, a $SF_6$ plasma, or the like) or a wet etchant (e.g., hydrofluoric acid (HF), potassium hydroxide (KOH), piranha etch, or the like). In some embodiments, the fourth mask 2804 may comprise a photosensitive material (e.g., a photoresist), a hard mask, or the like.

Figure 29:
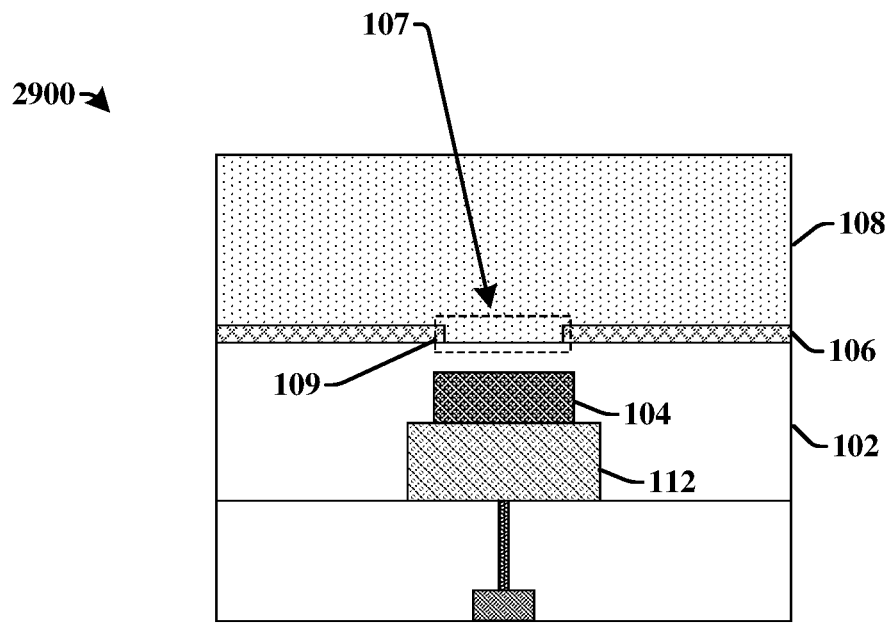

As shown in cross-sectional view 2900 of FIG. 29, a second semiconductor material 108 is formed on the patterned doped layer 106. The second semiconductor material 108 is formed to have a protrusion 109 that extends through the one or more channel openings 107 to contact the substrate 102 at or below a bottom of the patterned doped layer 106. In some embodiments, the second semiconductor material 108 may be formed by way of a deposition process (e.g., a PVD process, a CVD process, a PE-CVD process, a high-density IMP deposition, a high-density ICP deposition, a sputtering process, a LP-CVD, or the like).

Figure 30:
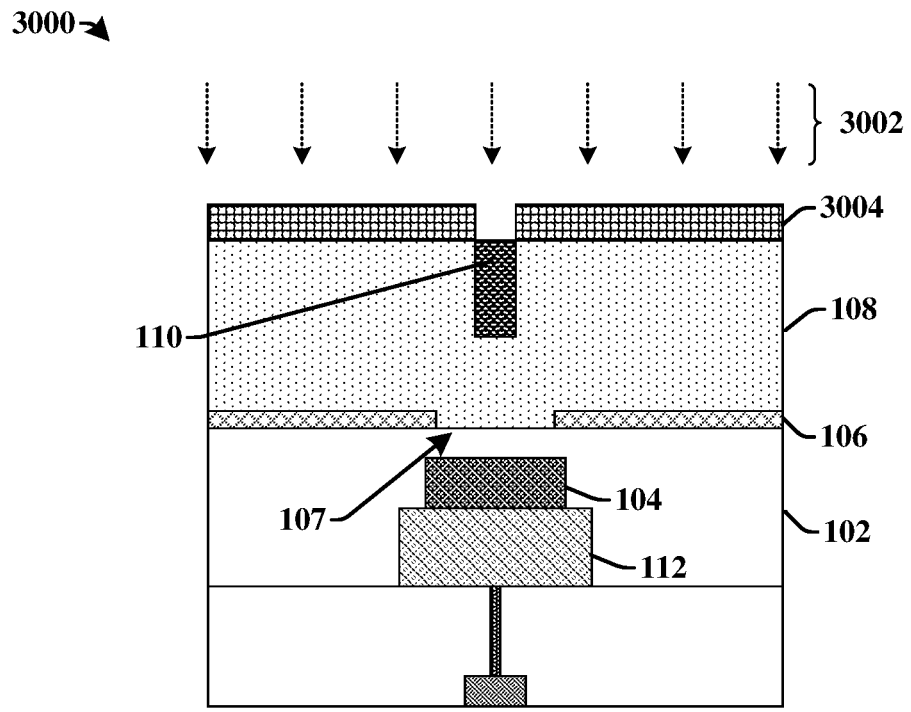

As shown in cross-sectional view 3000 of FIG. 30, a first doped contact region 110 is formed within the second semiconductor material 108. In some embodiments, the first doped contact region 110 may be formed by selectively implanting a fourth dopant species 3002 into the second semiconductor material 108 according to a fourth mask 3004. In various embodiments, the fourth mask 3004 may comprise an oxide, a photoresist, or other similar materials.

Figure 31:
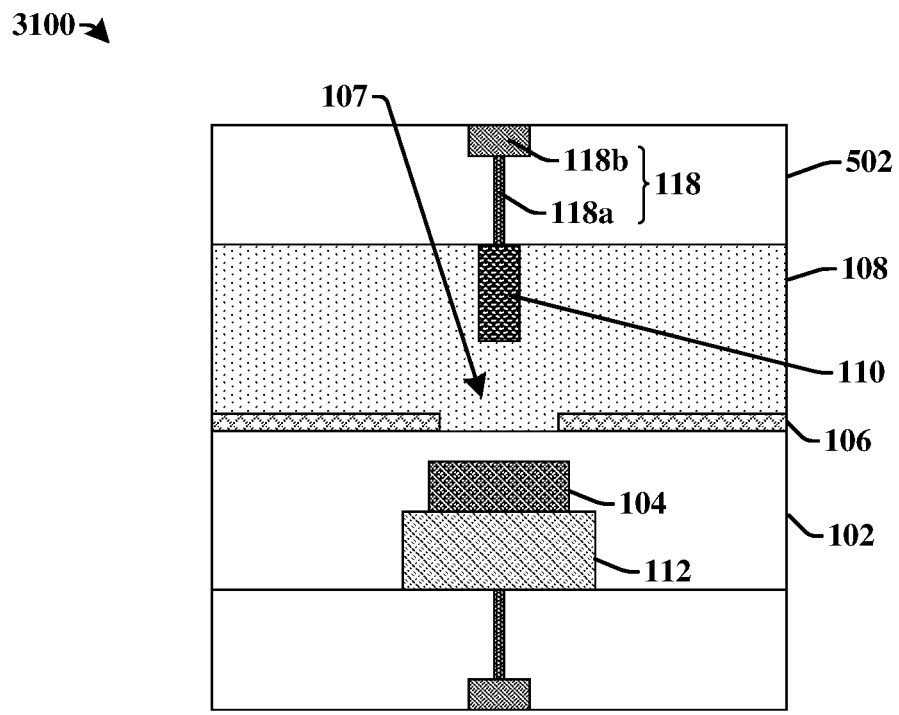

As shown in cross-sectional view 3100 of FIG. 31, an additional dielectric structure 502 is formed over the second semiconductor material 108. In some embodiments, the additional dielectric structure 502 may be formed by one or more deposition processes (e.g., a PVD process, a CVD process, a PE-CVD process, a high-density IMP deposition, a high-density ICP deposition, a sputtering process, a LP-CVD process, or the like). A second plurality of interconnects 118 are formed in the additional dielectric structure 502. In some embodiments, the second plurality of interconnects 118 may comprise a conductive contact, an interconnect, and/or an interconnect wire.

Figure 32:
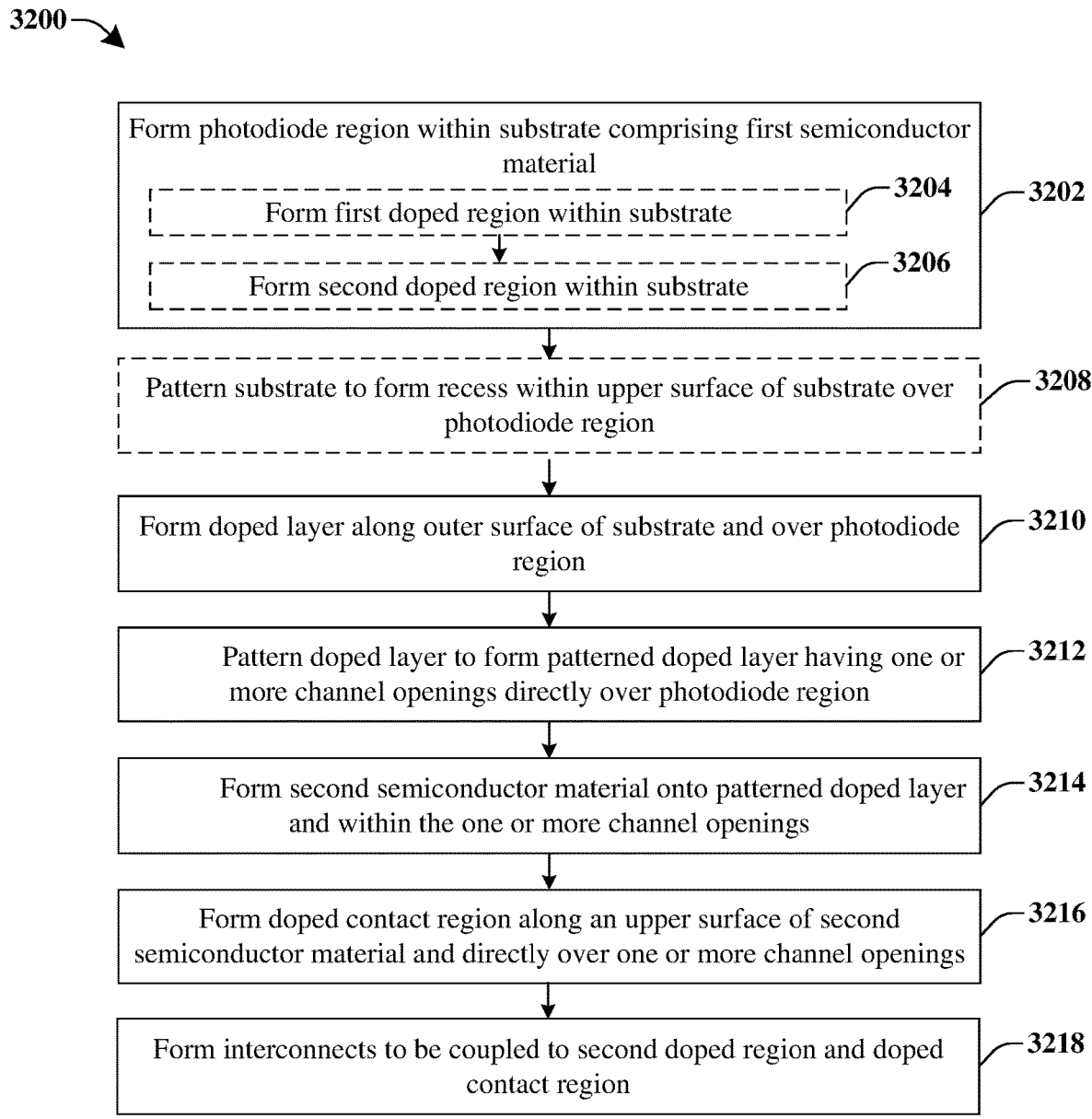
FIG. 32 illustrates a flow diagram of some embodiments of a method of forming an image sensor integrated chip comprising a patterned doped layer.

FIG. 32 illustrates a flow diagram of some embodiments of a method 3200 of forming an image sensor integrated chip comprising a disclosed patterned doped layer.

While method 3200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 3202, a photodiode region is formed within a substrate comprising a first semiconductor material. In some embodiments, the photodiode region may be formed according to acts 3204-3206.

Figure 12:
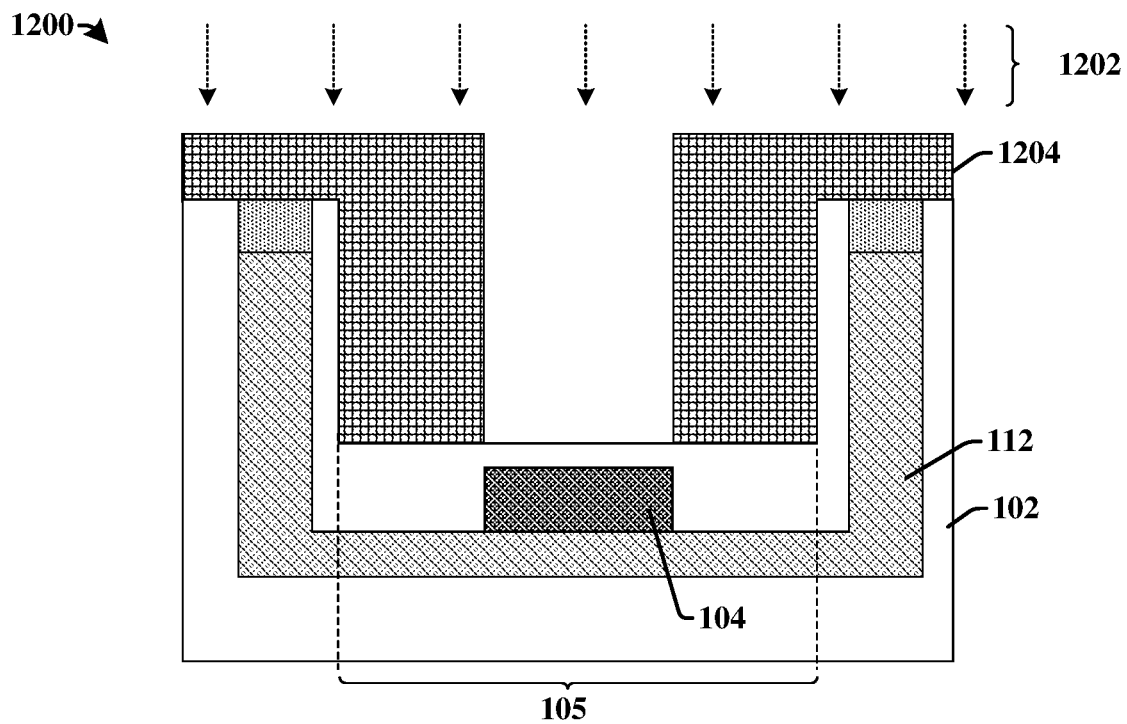

At 3204, a first doped region may be formed within the substrate in some embodiments. FIG. 12 illustrates a cross-sectional view 1200 of some embodiments corresponding to act 3204. FIG. 21 illustrates a cross-sectional view 2100 of some additional embodiments corresponding to act 3204.

At 3206, a second doped region is formed within the substrate. FIGS. 8-9 illustrate cross-sectional views 800-900 of some embodiments corresponding to act 3206. FIG. 22 illustrates a cross-sectional view 2200 of some additional embodiments corresponding to act 3206.

At 3208, the substrate may be patterned to form a recess within an upper surface of the substrate over the photodiode region, in some embodiments. FIG. 11 illustrates a cross-sectional view 1100 of some embodiments corresponding to act 3208.

At 3210, a doped layer is formed along an outer surface of the substrate and over the photodiode region. FIG. 13 illustrates a cross-sectional view 1300 of some embodiments corresponding to act 3210. FIG. 26 illustrates a cross-sectional view 2600 of some additional embodiments corresponding to act 3210.

At act 3212, the doped layer is patterned to form a patterned doped layer having one or more channel openings directly over the photodiode region. FIG. 15 illustrates a cross-sectional view 1500 of some embodiments corresponding to act 3212. FIGS. 27-28 illustrate cross-sectional views 2700-2800 of some additional embodiments corresponding to act 3212.

At act 3214, a second semiconductor material is formed on the patterned doped layer and within the one or more channel openings. FIG. 17 illustrates a cross-sectional view 1700 of some embodiments corresponding to act 3214. FIG. 29 illustrates a cross-sectional view 2900 of some additional embodiments corresponding to act 3214.

At act 3216, a doped contact region is formed along an upper surface the second semiconductor material and directly over the one or more channel openings. FIGS. 18-19 illustrate cross-sectional views 1800-1900 of some embodiments corresponding to act 3216. FIG. 30 illustrates a cross-sectional view 3000 of some additional embodiments corresponding to act 3216.

At act 3218, interconnects are formed to be coupled to the second doped region and the doped contact region. FIG. 20 illustrates a cross-sectional view 2000 of some embodiments corresponding to act 3218. FIGS. 23 and 31 illustrate cross-sectional views 2300 and 3100 of some additional embodiments corresponding to act 3218.

Accordingly, the present disclosure relates to an image sensor integrated chip comprising a patterned doped layer arranged between a photodiode region within a substrate comprising a first semiconductor material and a second semiconductor material on the substrate. The second semiconductor material extends through one or more channel openings in the patterned doped layer, so as to provide for a relatively low barrier between the second semiconductor material and the photodiode region. The relatively low barrier increases performance of the image sensor integrated chip while the patterned doped layer decreases leakage currents, thereby providing the disclosed image sensor integrated chip with both a good performance and a low dark current.

In some embodiments, the present disclosure relates to an image sensor integrated chip. The image sensor integrated chip includes a photodiode region disposed within a substrate having a first semiconductor material region; a second semiconductor material region disposed onto the substrate; a patterned doped layer arranged between the substrate and the second semiconductor material region; and the second semiconductor material region including a sidewall connecting to a bottom surface of the second semiconductor material region, the sidewall extending through the patterned doped layer and the bottom surface being directly over the photodiode region. In some embodiments, a sidewall of the patterned doped layer laterally contacts the sidewall of the second semiconductor material region along an interface that is directly over the photodiode region. In some embodiments, the substrate includes sidewalls and a horizontally extending surface defining a recess within an upper surface of the substrate, the second semiconductor material region being disposed within the recess. In some embodiments, the image sensor integrated chip further includes a capping layer arranged on the second semiconductor material region and directly between the sidewalls of the substrate. In some embodiments, the patterned doped layer includes boron. In some embodiments, the second semiconductor material region vertically extends to below a bottom of the patterned doped layer. In some embodiments, the patterned doped layer is both laterally and vertically between the first semiconductor material region and the second semiconductor material region. In some embodiments, the patterned doped layer is a same semiconductor material region as the first semiconductor material region. In some embodiments, the photodiode region includes a first doped region having a first doping type, the first doped region being directly below the bottom surface of the second semiconductor material region; and a second doped region having a second doping type, the second doped region including a vertically extending second doped region coupled to a horizontally extending second doped region that contacts a bottom of the first doped region.

In other embodiments, the present disclosure relates to an image sensor integrated chip. The image sensor integrated chip includes a photodiode region disposed within a silicon substrate; a patterned doped silicon layer disposed on the silicon substrate, the patterned doped silicon layer having sidewalls directly overlying the photodiode region; a germanium region disposed onto the patterned doped silicon layer, the germanium region having a protrusion extending outward from a lower surface of the germanium region to directly between the sidewalls of the patterned doped silicon layer; a first interconnect coupled to a doped region, the doped region extending from the first interconnect to the photodiode region; and a second interconnect coupled to a first doped contact region, the first doped contact region disposed within the germanium region directly over both the photodiode region and the protrusion of the germanium region. In some embodiments, the image sensor integrated chip further includes a dielectric structure disposed over the germanium region and the silicon substrate, the dielectric structure laterally surrounding the first interconnect and the second interconnect. In some embodiments, the image sensor integrated chip further includes a first dielectric structure disposed below the silicon substrate and surrounding the first interconnect; and a second dielectric structure disposed over the germanium region and surrounding the second interconnect. In some embodiments, the patterned doped silicon layer includes a plurality of sidewalls laterally separated from one another by the patterned doped silicon layer, the plurality of sidewalls defining a plurality of separate channel openings extending through the patterned doped silicon layer; and the germanium region extends through the plurality of separate channel openings to contact the silicon substrate. In some embodiments, the plurality of separate channel openings are disposed in an array and are separated from one another along a first direction and along a second direction that is perpendicular to the first direction, the first direction and the second direction being parallel to the lower surface of the germanium region. In some embodiments, the protrusion laterally extends past opposing sides of the photodiode region.

In yet other embodiments, the present disclosure relates to a method of forming an image sensor integrated chip. The method includes forming a photodiode region within a substrate having a first semiconductor material region; forming a doped layer along an outer surface of the substrate and over the photodiode region; patterning the doped layer to form a patterned doped layer having one or more sidewalls that define one or more channel openings that extends through the patterned doped layer directly over the photodiode region; and forming a second semiconductor material region onto the patterned doped layer and within the one or more channel openings. In some embodiments, the method further includes forming the photodiode region includes performing a first implantation process to form a first doped region having a first doping type; and performing a second implantation process to form a second doped region having a second doping type, the second doped region below the first doped region. In some embodiments, the second doped region includes a horizontally extending second doped region extending below a bottom of the second semiconductor material region and a vertically extending second doped region extending along a sidewall of the second semiconductor material region. In some embodiments, the method further includes patterning the substrate to form a recess within an upper surface of the substrate; forming the second semiconductor material region within the recess; and performing a planarization process to remove excess of the second semiconductor material region from over the substrate. In some embodiments, the method further includes performing an etching process to recess the second semiconductor material region below an upper surface of the substrate; forming a capping layer over the second semiconductor material region; and forming a doped contact region within the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor integrated chip, comprising:
a photodiode region disposed within a substrate comprising a first semiconductor material region;
a second semiconductor material region disposed onto the substrate;
a patterned doped layer arranged between the substrate and the second semiconductor material region; and
wherein the second semiconductor material region comprises a sidewall connected to a bottom surface of the second semiconductor material region, the sidewall extending through the patterned doped layer and the bottom surface being directly over the photodiode region.

2. The image sensor integrated chip of claim 1, wherein a sidewall of the patterned doped layer laterally contacts the sidewall of the second semiconductor material region along an interface that is directly over the photodiode region.

3. The image sensor integrated chip of claim 1, wherein the substrate comprises sidewalls and a horizontally extending surface defining a recess within an upper surface of the substrate, the second semiconductor material region being disposed within the recess.

4. The image sensor integrated chip of claim 3, further comprising:
a capping layer arranged on the second semiconductor material region and directly between the sidewalls of the substrate.

5. The image sensor integrated chip of claim 1, wherein the patterned doped layer comprises boron.

6. The image sensor integrated chip of claim 1, wherein the second semiconductor material region vertically extends to below a bottom of the patterned doped layer.

7. The image sensor integrated chip of claim 1, wherein the patterned doped layer is both laterally and vertically between the first semiconductor material region and the second semiconductor material region.

8. The image sensor integrated chip of claim 1, wherein the patterned doped layer is a same semiconductor material region as the first semiconductor material region.

9. The image sensor integrated chip of claim 1, wherein the photodiode region comprises:
a first doped region having a first doping type, wherein the first doped region is directly below the bottom surface of the second semiconductor material region; and
a second doped region having a second doping type, wherein the second doped region comprises a vertically extending second doped region coupled to a horizontally extending second doped region that contacts a bottom of the first doped region.

10. An image sensor integrated chip, comprising:
a photodiode region disposed within a silicon substrate;
a patterned doped silicon layer disposed on the silicon substrate, the patterned doped silicon layer having sidewalls directly overlying the photodiode region;
a germanium region disposed onto the patterned doped silicon layer, wherein the germanium region comprises a protrusion extending outward from a lower surface of the germanium region to directly between the sidewalls of the patterned doped silicon layer;
a first interconnect coupled to a doped region, the doped region extending from the first interconnect to the photodiode region; and
a second interconnect coupled to a first doped contact region, the first doped contact region disposed within the germanium region directly over both the photodiode region and the protrusion of the germanium region.

11. The image sensor integrated chip of claim 10, further comprising:
a dielectric structure disposed over the germanium region and the silicon substrate, wherein the dielectric structure laterally surrounds the first interconnect and the second interconnect.

12. The image sensor integrated chip of claim 10, further comprising:
a first dielectric structure disposed below the silicon substrate and surrounding the first interconnect; and
a second dielectric structure disposed over the germanium region and surrounding the second interconnect.

13. The image sensor integrated chip of claim 10,
wherein the patterned doped silicon layer comprises a plurality of sidewalls laterally separated from one another by the patterned doped silicon layer, the plurality of sidewalls defining a plurality of separate channel openings extending through the patterned doped silicon layer; and
wherein the germanium region extends through the plurality of separate channel openings to contact the silicon substrate.

14. The image sensor integrated chip of claim 13, wherein the plurality of separate channel openings are disposed in an array and are separated from one another along a first direction and along a second direction that is perpendicular to the first direction, the first direction and the second direction being parallel to the lower surface of the germanium region.

15. The image sensor integrated chip of claim 10, wherein the protrusion has a smaller width than the photodiode region.

16. A method of forming an image sensor integrated chip, comprising:
forming a photodiode region within a substrate comprising a first semiconductor material region;
forming a doped layer along an outer surface of the substrate and over the photodiode region;
patterning the doped layer to form a patterned doped layer having one or more sidewalls that define one or more channel openings that extend through the patterned doped layer directly over the photodiode region; and
forming a second semiconductor material region onto the patterned doped layer and within the one or more channel openings.

17. The method of claim 16, wherein forming the photodiode region comprises:
performing a first implantation process to form a first doped region having a first doping type; and
performing a second implantation process to form a second doped region having a second doping type, the second doped region below the first doped region.

18. The method of claim 17, wherein the second doped region comprises a horizontally extending second doped region extending below a bottom of the second semiconductor material region and a vertically extending second doped region extending along a sidewall of the second semiconductor material region.

19. The method of claim 16, further comprising:
patterning the substrate to form a recess within an upper surface of the substrate;
forming the second semiconductor material region within the recess; and
performing a planarization process to remove excess of the second semiconductor material region from over the substrate.

20. The method of claim 16, further comprising:
performing an etching process to recess the second semiconductor material region below an upper surface of the substrate;
forming a capping layer over the second semiconductor material region; and
forming a doped contact region within the capping layer.

* * * * *